US010389117B2

(12) United States Patent
Ji et al.

(10) Patent No.: US 10,389,117 B2
(45) Date of Patent: Aug. 20, 2019

(54) DYNAMIC MODELING AND RESILIENCE FOR POWER DISTRIBUTION

(71) Applicant: Georgia Tech Research Corporation, Atlanta, GA (US)

(72) Inventors: Chuanyi Ji, Smyrna, GA (US); Yun Wei, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 259 days.

(21) Appl. No.: 14/711,708

(22) Filed: May 13, 2015

(65) Prior Publication Data

US 2015/0331063 A1    Nov. 19, 2015

Related U.S. Application Data

(60) Provisional application No. 62/065,408, filed on Oct. 17, 2014, provisional application No. 61/992,304, filed on May 13, 2014.

(51) Int. Cl.
| | |
|---|---|
| *G01R 31/00* | (2006.01) |
| *G01R 31/08* | (2006.01) |
| *G06F 17/18* | (2006.01) |
| *H02J 3/00* | (2006.01) |
| *G01R 19/25* | (2006.01) |

(52) U.S. Cl.
CPC .......... *H02J 3/00* (2013.01); *G01R 19/2513* (2013.01); *G01R 31/08* (2013.01); *G01R 31/086* (2013.01); *H02J 2003/007* (2013.01); *Y02E 60/76* (2013.01); *Y04S 10/522* (2013.01); *Y04S 40/22* (2013.01)

(58) Field of Classification Search
CPC .... H02J 3/00; H02J 2003/007; G01R 31/086; Y02E 60/76; Y04S 10/522; Y04S 40/22
USPC .......................................................... 702/58
See application file for complete search history.

(56) References Cited

U.S. PATENT DOCUMENTS

| | | | |
|---|---|---|---|
| 9,558,453 B1 | 1/2017 | Chaudhary | |
| 9,625,928 B2 * | 4/2017 | Hajimiragha | G05F 1/66 |
| 2006/0116794 A1 * | 6/2006 | Stoupis | H02J 13/001 |
| | | | 700/286 |

(Continued)

OTHER PUBLICATIONS

D. A. Reed, "Electric utility distribution analysis for extreme winds," J. Wind Eng. Ind. Aerodyn., vol. 96, No. 1, pp. 123-140, 2008.

(Continued)

*Primary Examiner* — Ly D Pham
(74) *Attorney, Agent, or Firm* — Thomas Horstmeyer, LLP

(57) ABSTRACT

Various examples of methods and systems are provided for power distribution analysis and control. Dynamic modeling and resilience of a power distribution network can be utilized for response to disruptions in power distribution induced by event such as, e.g., severe weather. In one implementation, among others, a resilience metric can be determined based at least in part upon failure neighborhoods and recovery neighborhoods and operational information associated with a power distribution network. A vulnerability of the power distribution network can then be identified based at least in part upon the resilience metric and a response can be determined. The failure neighborhoods and recovery neighborhoods can be identified based at least in part upon a topology of the power distribution network and the operational information associated with the power distribution network.

20 Claims, 13 Drawing Sheets

(56) References Cited

U.S. PATENT DOCUMENTS

| | | | | |
|---|---|---|---|---|
| 2010/0125383 | A1* | 5/2010 | Caouette | B63H 21/17 701/21 |
| 2010/0145641 | A1* | 6/2010 | Bose | G01R 31/327 702/58 |
| 2011/0313581 | A1* | 12/2011 | Genc | G05B 23/0248 700/292 |
| 2012/0036250 | A1* | 2/2012 | Vaswani | G01D 4/004 709/224 |
| 2012/0253532 | A1* | 10/2012 | McMullin | G06Q 50/06 700/291 |
| 2013/0024579 | A1* | 1/2013 | Zhang | H04W 16/18 709/230 |
| 2013/0028073 | A1* | 1/2013 | Tatipamula | H04L 41/12 370/218 |
| 2013/0054042 | A1* | 2/2013 | du Toit | H02H 7/26 700/292 |
| 2013/0132149 | A1* | 5/2013 | Wei | G05B 23/0281 705/7.28 |
| 2013/0215769 | A1* | 8/2013 | Beheshti-Zavareh | H04L 45/64 370/252 |
| 2013/0317629 | A1* | 11/2013 | Shapiro | G05B 13/02 700/31 |
| 2014/0025211 | A1* | 1/2014 | Cheim | G05B 13/02 700/286 |
| 2014/0148960 | A1* | 5/2014 | Bhageria | G05B 15/02 700/286 |
| 2014/0156323 | A1* | 6/2014 | Prieto | G06Q 10/0633 705/7.12 |
| 2014/0350739 | A1* | 11/2014 | Gouzman | G05F 1/70 700/291 |
| 2015/0213564 | A1* | 7/2015 | Ishida | G06Q 30/0204 705/7.33 |
| 2015/0241893 | A1* | 8/2015 | Hajimiragha | G05F 1/66 700/297 |

* cited by examiner

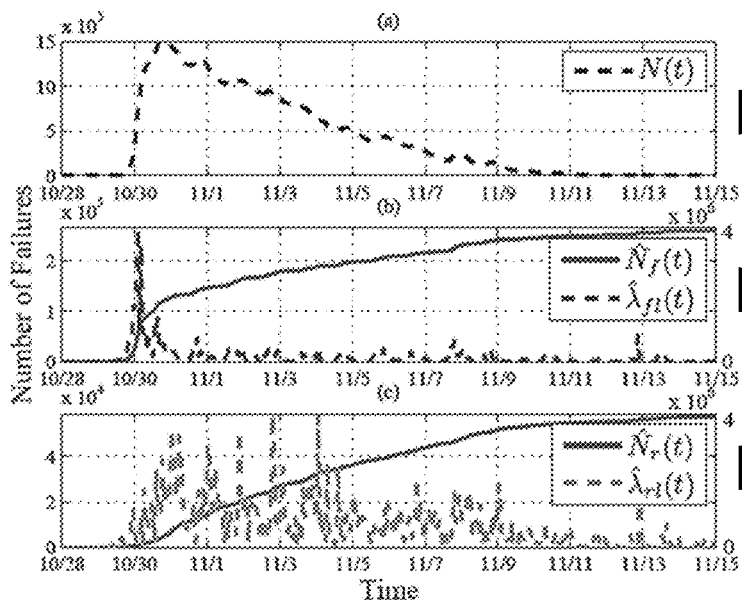
FIG. 17A
FIG. 17B
FIG. 17C
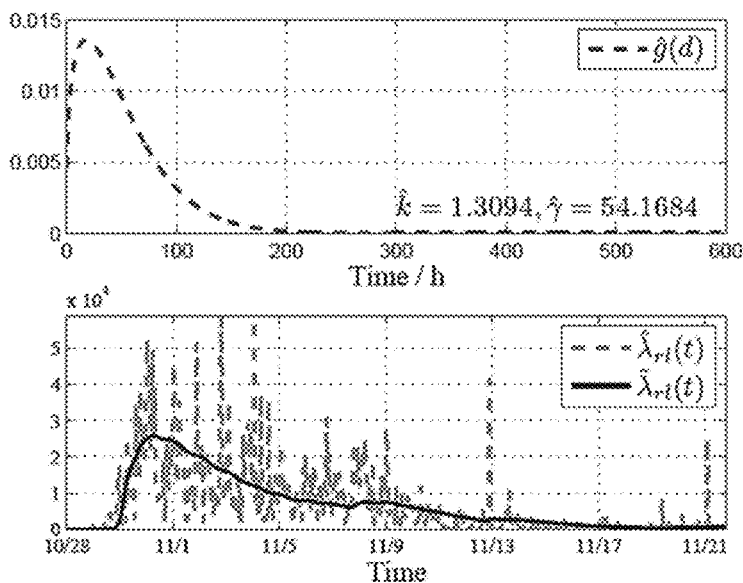
FIG. 18

DYNAMIC MODELING AND RESILIENCE FOR POWER DISTRIBUTION

CROSS REFERENCE TO RELATED APPLICATIONS

This application claims priority to, and the benefit of, U.S. provisional application entitled "Dynamic Modeling and Resilience for Power Distribution" having Ser. No. 61/992,304, filed May 13, 2014, and U.S. provisional application entitled "Dynamic Modeling and Resilience for Power Distribution" having Ser. No. 62/065,408, filed Oct. 17, 2014, both of which are hereby incorporated by reference in their entirety.

BACKGROUND

Severe weather events such as hurricanes and storms have been occurring more frequently in America in recent years, each of which resulted in a half to several million customers without electricity for days. Power distribution was often impacted the most, as a compound effect of severe weather and an outdated infrastructure. Distribution networks lie at the edge of the power grid with a large number of components across a wide geographical span. Those components can be either aging or not well-protected, and are thus susceptible to severe weather.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 17A through 17C are plots illustrating examples of failure and recovery processes during hurricane Sandy in accordance with various embodiments of the present disclosure.

FIG. 18 includes plots illustrating examples of Weibull distribution for failure durations during hurricane Sandy in accordance with various embodiments of the present disclosure.

DETAILED DESCRIPTION

Figure 1:
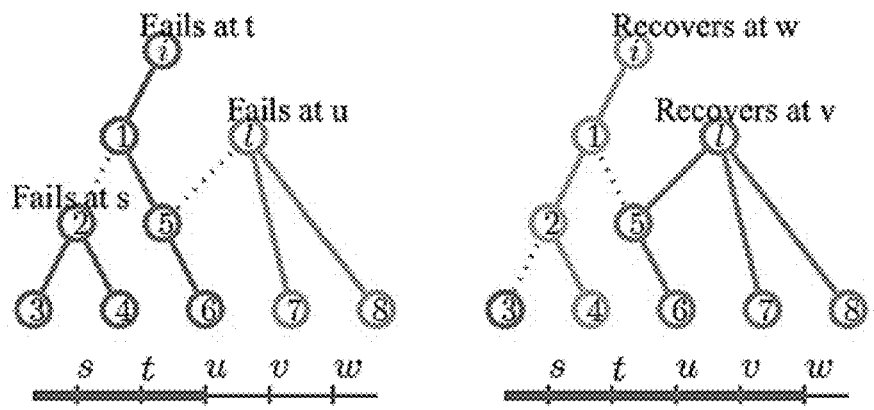
FIG. 1 is a graphical representation of an example of neighborhoods in accordance with various embodiments of the present disclosure.

Disclosed herein are various embodiments of methods related to spatial-temporal non-stationary random processes to model large-scale disruptions of power distribution induced by severe weather. Reference will now be made in detail to the description of the embodiments as illustrated in the drawings, wherein like reference numbers indicate like parts throughout the several views.

Resilience metrics do not exist for power distribution under large-scale severe weather disruptions. Evaluation methods are thus lacking on resilience of power distribution networks and services by utilities. Embodiments of the present disclosure develop novel resilience metrics and their evaluation using non-stationary random processes in a network setting. The evaluation utilizes large-scale data and novel data analysis. The metrics and evaluation methods can be used by utilities and policy makers for quantifying resilience of their service networks.

Part A

Embodiments of the present disclosure develop a spatial-temporal non-stationary random process to model large-scale disruptions of power distribution induced by severe weather. The model combines non-stationary failure- and recovery-random processes with network structures. Dynamic failure- and recovery-neighborhoods are defined to characterize a topological network structure. The neighborhoods characterize correlated failures and recoveries within networks. Dynamic disruption- and recovery-rates are used as simple quantities for failure- and recovery processes at both component- and subnetwork-level. A resilience metric resulting from the model then characterizes the evolution of failure and recovery. Real data from an operational network during Hurricane Ike was used to study the resilience and the impact of dynamic neighborhoods. An 80/20 rule emerged for failures, showing that hurricane-induced power-disruptions are mostly correlated due to network structures. In contrast, recoveries occur mainly in small patches, and thus involved individual restorations. These findings reveal disparities between large-scale failures and recovery processes, which may be used for identifying vulnerabilities and improving resilience of power distribution networks at, e.g., the component level.

Empirical approaches have been used widely in industry for weather induced failures. However, empirical approaches have become inadequate for large-scale weather-induced disruptions that have occurred frequently in recent years. Static models have been developed for identifying variables related to failures of power distribution. However, dynamic models and resilience are needed for characterizing the time-varying nature of weather-induced large-scale failure and recovery.

Resilience corresponds to the ability of the grid to withstand external disturbances and to recover rapidly from failures. Resilience involves multiple spatial-temporal scales. A small spatial scale exists at the component-level where failures and restorations occur. A large spatial scale is at the subnetwork level where resilience is measured through aggregating component failures and recoveries in a service area. A small temporal scale of subminutes is when topologically correlated failures occur, and when electricity is regained through self-healing. A large temporal scale of minutes and beyond is when failures and restorations occur due to severe weather and manual repair respectively. For resilience to encompass the pertinent multi-scale characteristics, a rigorous problem formulation is needed from bottom-up, i.e., from modeling to defining resilience/vulnerability at the multiple scales. This work develops such an approach by focusing on the following challenges.

A first challenge is stochasticity where failures and recoveries occur randomly and dynamically. Failure stochasticity results from spatial-temporal evolution of external weather. Recovery stochasticity results from environmental conditions of the aftermath of a severe weather event. In addition, failures and restorations exhibit non-stationarity with different behaviours at different times and locations. Existing approaches in power systems account for randomness of failures but rarely account for the dynamics or spatial-temporal non-stationarity.

Embodiments of the present disclosure include the effect of network structures through a new notion of dynamic neighborhoods. Dynamic neighborhoods characterize how weather-induced failures are exacerbated by network structures. The resulting model is a spatial-temporal non-stationary random process that encompasses topological network structures, different network components, dynamic failure, and recovery.

An additional challenge is how to define resilience. Static metrics on resilience have been widely used. These metrics, however, do not characterize the dynamic nature of large-scale failures induced by severe weather. In addition, resilience needs to include recovery from failures. Embodiments of the present disclosure define the resilience as a dynamic metric, motivated by those from communication networks. Importantly, the dynamic resilience metric is based on the spatial temporal model derived from bottom up. The metric thus reflects the impact of dynamic network neighborhoods in addition to weather-induced failures and recoveries.

The non-stationary model and the resilience metric are applied to a real life example of large scale power failures during Hurricane Ike in 2008. Real data from an operational network was used to learn parameters of failure and recovery processes as well as the resilience metric.

Consider a node that represents a network component such as a substation, a transformer, or a link such as a feeder/power line. Severe weather can induce a failure directly at that node. For example, flooding can result in a non-functional substation and/or other equipment failures. High winds can cause fallen poles or trees to disrupt power lines. Such weather-induced failures often occur in the initial minutes resulting from evolving severe-weather conditions.

A weather-induced failure, referred to as a failure in short, can result in secondary failures through a network structure. A network structure comprises a topology and different types of components. For example, unbalanced currents from a failure can cause burned line fuses as secondary failures. A failure upstream can also result in losses of electricity, but no damage, at nodes downstream in a distribution tree. For example, either a non-functional substation or a broken link can cause a loss of power to downstream nodes. Those nodes without electricity service are referred to as outages. Secondary failures and outages occur at a smaller time scale of subminutes, as impacted by a network structure. Disruptions include failures, secondary failures and outages.

Recovery also occurs at two time-scales. Self-recovery occurs in subminutes, while manual repairs to damaged nodes occur at the time scale of minutes or longer. When a failure- or an outage-node regains electricity supply, downstream outage nodes regain the service together. Hence, the multi-scale characteristics need to be quantified for disruption and recovery respectively.

Let $X_i^{(w)}(t)$ be the state of node i at time t, where i specifies both a network location and a geo-location of the node, $1 \leq i \leq n$, where n is the total number of nodes in the network, and $t>0$ is continuous time. For simplicity, a node takes on one of two states: $X_i^{(w)}(t)=1$ if node i is in disruption or $X_i^{(w)}(t)=0$ if node i is in normal operation. Three scenarios are specified by w: w=f for a failure induced by exogenous weather, w=f' for a secondary failure, and w=o for an outage. An outage or a secondary failure is induced by a failure occurring at a network neighbor. A network neighbor here is a node at the upstream of a distribution network with a tree topology.

Disruption: $A_i^{(w)}(t)$ is a state transition from normal to disruption $\{X_i^{(w)}(t-\Delta t)=0, X_i^{(w)}(t)=1\}$, which occurs in $(t-\Delta t,t]$ at node i, $t>0$, and w={f, f', o}. $\Delta t>0$ is sufficiently small so that there is only one failure, and one set of secondary failures or outages that occurred in $(t-\Delta t,t]$.

Failure Neighborhood:

$V_i^{(f)}(t)$ is a new notion of dynamic topology, comprising the downstream nodes that are in normal operation preceding failure i at t−Δt. That is, for any $j \in V_i^{(f)}(t)$, either outage $A_j^{(o)}(t)$ or secondary failure $A_j^{(f')}(t)$ occurring with failure i. Hence, a failure neighborhood characterizes correlated failures and outages.

Recovery:

$B_i^{(w)}(t)$ is the state transition from disruption back to normal $\{X_j^{(w)}(t-\Delta t)=1, X_j^{(w)}(t)=0\}$, which occurs in $(t-\Delta t,t]$ at node i, $t>0$, w={f, f', o}. When w=f (or w=f'), failure i is repaired. When w=o, an upstream neighbor of node i is repaired.

Recovery Neighborhood:

$V_i^{(r)}(t)$ is another new notion of dynamic topology, comprising the downstream neighbors of node i that are in outage at $(t-\Delta t,t)$ prior to the restoration. $\Delta t>0$ is sufficiently small so that there is one restoration and one set $V_i^{(r)}(t)$ of recoveries in $(t-\Delta t,t]$.

FIG. 1 illustrates an example of disruption and recovery, as well as the neighborhoods. First, node 2 fails at time s, inducing secondary failure 3 and outage 4, i.e., $V_2^{(f)}(s)=\{3, 4\}$. Then node i fails at time t>s, inducing outages to nodes in the failure neighborhood $V_i^{(f)}(t)=\{1,5,6\}$. Then node 1 fails at time u>t, inducing outages to $V_i^{(f)}(u)=\{7,8\}$. Note that node 5 is a downstream neighbor of both nodes i and 1 but only belongs to the failure neighborhood $V_i^{(f)}(t)$ of node i by definition. Hence, the failure neighborhoods are non-overlapping for failures occurring at different locations and time.

Failure 1 is repaired at time v>u, restoring failure 1 and outages in recovery neighborhood $V_1^{(r)}(v)=\{5,6,7,8\}$. Finally, failure i is repaired at time w>v, restoring failure i and outages in $V_i^{(r)}(w)=\{1,2,4\}$. Secondary failure 3 remains to be restored. This example illustrates failure- and recovery-neighborhoods that are dynamically changing due to evolving failures and reconfiguration in restoration.

A dynamic network environment emerges from the above problem setting. External severe weather causes network nodes to fail. The failed nodes induce secondary failures and outages at their network neighbors. Failures/outages then recover together with their neighbors. Such disruption and recovery can be modeled as non-stationary spatial temporal random processes, with dynamic neighborhoods at the component-level, and aggregations of components in a service region.

The modeling starts from the component-level. To begin, n nodes in a tree topology form a spatial temporal process, comprising a network of random state transitions as binary variables $\{I[A_i^{(w)}(t)], I[B_i^{(w)}(t)]\}$, for $t>0$, $1 \le i \le n$, and $w=\{f, f', o\}$. $I(A)$ is an indicator function with $I(A)=1$ if the event A occurs; otherwise, $I(A)=0$. Let $\Delta N_i^{(d)}(t)$ be the number of nodes that are disrupted from electricity service in $(t-\Delta t,t]$. For a sufficiently small $\Delta t>0$, it is natural to assume that only one weather-induced failure occurs at node i, and one set of related secondary failures and outages in $(t-\Delta t,t]$. Then $$\Delta N_i^{(d)}(t) = I[A_i^{(f)}(t)] + v_i^{(f)}(t)I[A_i^{(f)}(t)], \quad (1)$$

where $v_i^{(f)}(t)I[A_i^{(f)}(t)]$ is a set of secondary failures and outages in neighborhood $V_i^{(f)}(t)$. $v_i^{(f)}(t) = \|V_i^{(f)}(t)\|$ is the size of the failure neighborhood at node i and time t. $v_i^{(f)}(t)$ characterizes correlated disruptions. The larger $v_i^{(f)}(t)$ is, the more correlated disruptions for the node at time t.

The failure rate of node i at time t is the expected number of state transitions from normal to (weather-induced) failures per unit time at node i, which is given by:

$$\lambda_i^{(f)}(t) = \lim_{\Delta t \to 0} \frac{E\{I[A_i^{(f)}(t)]\}}{\Delta t}. \quad (2)$$

Here $E\{\cdot\}$ represents expectation. The outage rate that is induced by failure i at time t is the expected number of state transitions from normal to outage per unit time at failure neighborhood $V_i^{(f)}(t)(t)$. For simplicity of notation, the outage rate here includes secondary failures also, where $$\lambda_i^{(o)}(t) = \lim_{\Delta t \to 0} \frac{E\{v_i^{(f)}(t)I[A_i^{(f)}(t)]\}}{\Delta t}. \quad (3)$$

The disruption rate at node i is $$\lambda_i^{(d)}(t) = \lim_{\Delta t \to 0} \frac{1}{\Delta t} E\{\Delta N_i^{(d)}(t)\},$$

$$\lambda_i^{(d)}(t) = \lambda_i^{(f)}(t) + \lambda_i^{(o)}(t). \quad (4)$$

A disruption rate shows the impact of severe weather and a network structure. A failure neighborhood shows explicitly impacts of topology and heterogeneous types of components.

The number of nodes that are recovered in $(t-\Delta t,t]$ can be obtained similarly, $$\Delta N_i^{(r)}(t) = I[B_i^{(f)}(t)] + v_i^{(r)}(t)I[B_i^{(f)}(t)], \quad (5)$$

where $I[B_i^{(f)}(t)]$ is the state of recovery for failure i and $v_i^{(r)}(t) = \|V_i^{(r)}(t)\|$ is the size of a recovery neighborhood $V_i^{(r)}(t)$. The recovery process can be characterized by the recovery rate defined as follows.

The recovery rate for node i and its neighbors in $V_i^{(r)}(t)$ at time t is $$\lambda_i^{(r)}(t) = \lim_{\Delta t \to 0} \frac{E\{I[B_i^{(f)}(t)](1 + v_i^{(r)}(t))\}}{\Delta t}. \quad (6)$$

The recovery rate and neighborhoods are dynamic, showing a changing topology in restoration. The time-varying rates and neighborhoods show the non-stationarity of disruption- and recovery-processes.

Now let $N^{(w)}(t)$ be the number of disruptions in a subnetwork in a service region, $$E\{N^{(w)}(t)\} = \int_0^t \lambda_{i(\tau)}^{(w)}(\tau) d\tau, \quad (7)$$

where $w=\{f, f', o\}$, $i(\tau)$ indicates the location of a disruption i at time $\tau$, and $d\tau$ is assumed to be small so that at most one failure and one neighborhood of secondary failures/outages occur in $(\tau-d\tau,\tau)$. The expected number of disruptions $E\{N^{(d)}(t)\}$ that occur up to time t is the sum of the expected failures and outages (with secondary failures), $$E\{N^{(d)}(t)\} = E\{N^{(f)}(t)\} + E\{N^{(o)}(t)\}. \quad (8)$$

Let $E\{N^{(r)}(t)\}$ be the expected number of nodes which recover in $[0, t]$ in a subnetwork, then:

$$E\{N^{(r)}(t)\} = \int_0^t \lambda_{i(\tau)}^{(r)}(\tau) d\tau. \quad (9)$$

The non-stationary spatial temporal model enables a novel resilience metric for power distribution. Before the metric is defined, fast versus slow recovery is first characterized based on concepts from infant and aging mortality. For infant (fast) and aging (slow) recovery, let duration $d_0 > 0$ be a threshold value. If a node remains in either failure or outage for less than $d_0$, the node has infant recovery. Otherwise, the node has aging recovery.

Using the threshold $d_0$, the resilience can be defined. Intuitively, resilience measures network-wide performance from two aspects. One is for a power grid to withstand external disruptions as much as possible. The other is to rapidly restore electricity service from failures. Hence, aging recovery is a complement of these two characteristics. Resilience can then characterized as one minus aging recovery.

Consider a subnetwork in region Z with m number of disruptions. The resilience of the subnetwork can be given by:

$$s(t, Z) = 1 - \frac{1}{m} \int_{\tau=0}^{t} \left( \sum_{w=f,o} \sum_{i(\tau) \in Z} \lambda_{i\tau}^{(w)}(\tau) Pr\{D_{i(\tau)}^{(w)}(\tau) > t - \tau + d_0\} \right) d\tau. \quad (10)$$

The second term corresponds to the expected percentage of aging recoveries at time t. The aging recoveries here correspond to disruptions at time t that would not recover for at least additional duration $d_0$. For example, when w=f, $\lambda_{i\tau}^{(f)} d\tau$ is the expected number of disruptions that occurred in $(\tau-d\tau, \tau]$. $Pr\{D_{i\tau}^{(w)}(\tau) > t-\tau+d_0\}$ is the probability for failures to last a duration longer than $t-\tau+d_0$. The product is the expected number of nodes that fail in $(\tau-d\tau, \tau]$ and do not recover at time $t+d_0$, which is simply the number of aging recoveries viewed at time t. The integral adds up all aging recoveries in duration [0, t] and region Z. Hence, s(t,Z) is the expected percentage of nodes in region Z at time t which are either in normal operation or recover within additional duration $d_0$. The resilience thus reflects temporal evolution of a network in response to severe weather.

The non-stationary spatial temporal model can now applied to studying the impact of a major hurricane. Real data from an operational network was used to obtain empirical disruption and recovery rates and to understand impacts of network structures.

Hurricane Ike was one of the strongest hurricanes that occurred in 2008. Ike resulted in more than two million customers without electricity in Louisiana and Texas. A major utility provider collected data on component failures and outages during the hurricane. The data set comprises 2004 samples (failures or outages) that occurred from 7 a.m. September 12th to 4 a.m. September 14th, the time period during which Hurricane Ike made landfall. Each sample comprises an occurrence time, duration, and location (latitude and longitude) of a disruption for a component in the distribution network. The accuracy for the recorded time t is one minute.

A failure neighborhood included those samples whose failure/outage occurrences fell within a minute. There were 204 failure neighborhoods of sizes from 1 to about 72. The remaining 260 failures individually occurred minutes apart. Similarly, samples with recovery occurrences within a minute were in a recovery neighborhood. There were 241 recovery neighborhoods and 824 individual recoveries.

The empirical non-stationary processes, the impact of topological network structures, and the resilience using the real data can now be examined. The empirical failure rate $\hat{\lambda}^{(f)}(t)$ and disruption rate $\hat{\lambda}^{(d)}(t)$ were estimated by aggregating over the components. The disruption rate takes into account the failure neighborhoods. The failure rate is calculated by aggregating disruptions occurring within a minute of one "failure". A simple moving average can be used, where $$\hat{\lambda}^{(w)}(t) = \frac{1}{2\tau} (\hat{N}^{(w)}(t+\tau) - \hat{N}^{(w)}(t-\tau)),$$

with $\tau$=1 hour and w={d,f}.

Figure 2A:
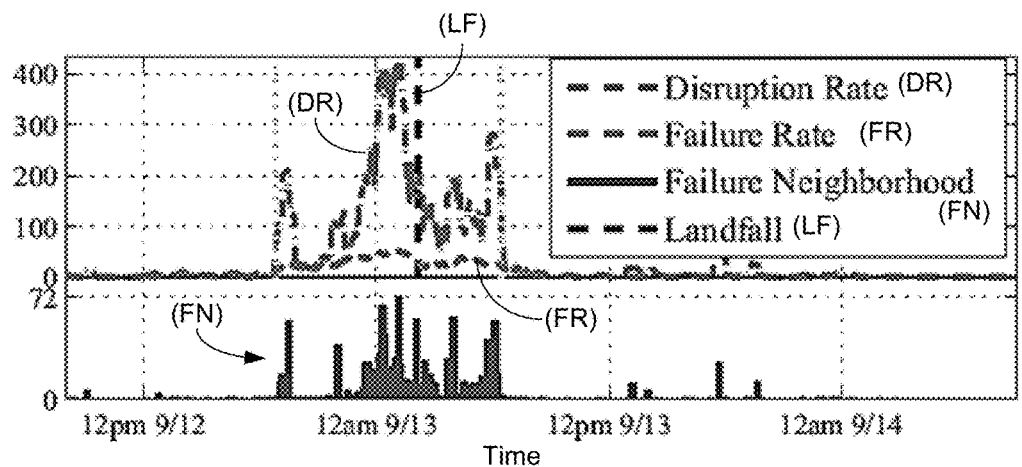
FIGS. 2A and 2B are plots illustrating examples of rate functions in accordance with various embodiments of the present disclosure.

Referring to FIG. 2A, shown is the disruption and failure rates of the network, as well as the size of the failure neighborhood. The rates and the failure neighborhoods are time-varying, showing the non-stationarity of the disruption process. The failure rate increased to the peak value of 50 new failures per hour around the landfall. The disruption rate exhibited a similar behavior but had a larger peak value of 450 new disruptions per hour around the landfall. The much larger disruption rate reflects the impact of dynamic network structure: There were a large number of correlated disruptions during the hurricane. This is further illustrated in FIG. 2A where large failure neighborhoods occurred mainly during the intense hurricane period, with as many as 72 disruptions in one neighborhood. Hence, the network components and topology were impacted by the hurricane differently during its evolution.

Figure 2B:
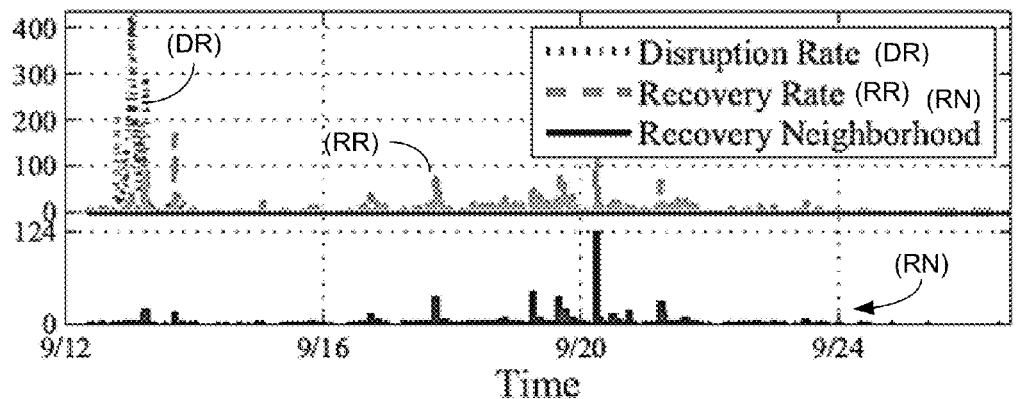

The recovery rate $\hat{\lambda}^{(r)}(t)$ and the size of recovery neighborhood $v_{i(t)}^{(r)}(t)$ are estimated similarly and illustrated in FIG. 2B. Two bursts of recoveries emerge. The first is an infant recovery that occurred along with major failures within six hours after the landfall. The second is an aging recovery that occurred about 7.7 hours after. The recovery rate and the size of the recovery-neighborhoods vary with time, showing the non-stationarity of the recovery process.

Dynamic failure neighborhoods are indicative of the impacts of topological network structures and the hurricane. The large failure neighborhoods around the landfall shown in FIG. 2A indicate that the hurricane induced a large number of correlated disruptions. In contrast, failures that occurred individually happened mainly before and after the hurricane. This suggests that correlated failures/outages occurred at the small time scale of subminutes, which can be a pertinent characteristic of the hurricane-induced disruptions.

Figure 3:
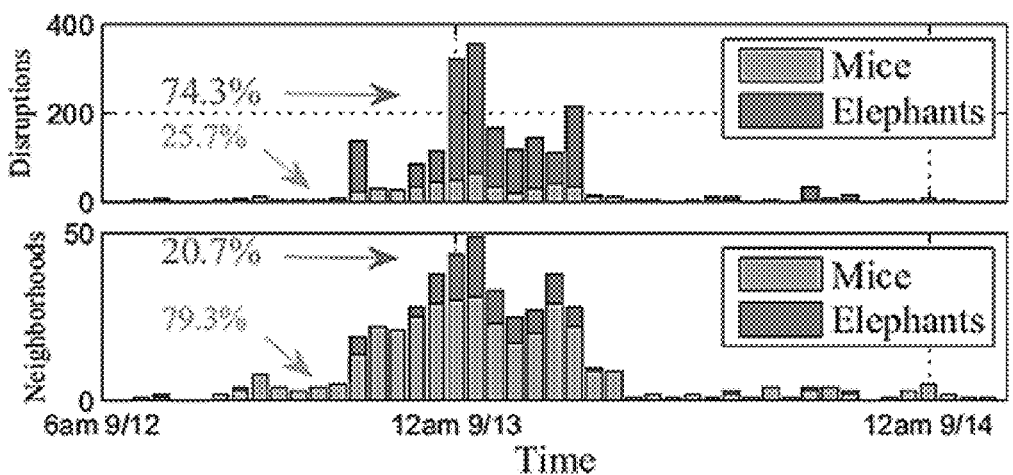
FIGS. 3 and 4 are histograms illustrating examples of disruptions and recoveries over time in accordance with various embodiments of the present disclosure.

Referring now to FIG. 3, shown are histograms of the disruptions and failure neighborhoods over time. Using the analogy of elephant and mice flows in computer communication, consider large neighborhoods to be elephants, and small neighborhoods to be mice. An 80/20 rule emerges for the disruption process: Elephant failure neighborhoods of size more than 2 contribute to 74.3% of total disruptions as shown in FIG. 3. However, the elephant failure neighborhoods amount to only 20.7% of the total failure neighborhoods. This implies that the majority of disruptions are correlated and induced by elephant failures.

Figure 4:
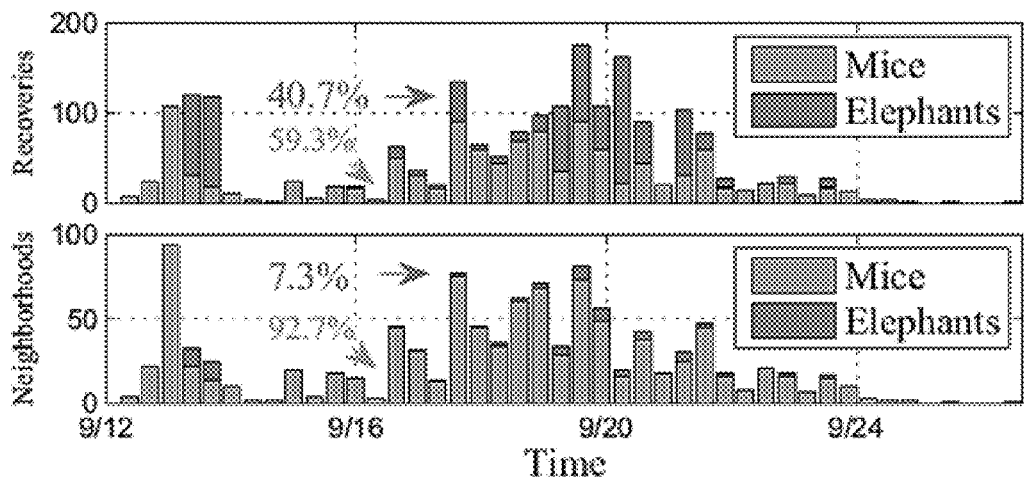

Referring next to FIG. 4, shown are histograms of the recoveries and recovery neighborhoods over time. Unlike the disruptions, recovery neighborhoods follow the 60/90 rule: The mice recovery neighborhoods of size 2 or less take up 92.7% of all recovery neighborhoods, amounting to 59.3% of recoveries, as shown in FIG. 4. This suggests that around 60% recoveries were uncorrelated, and thus needed individual restorations.

The empirical resilience in terms of aging recovery was obtained using real data. In general, threshold $d_0$ can be determined through failure and recovery rates. Here in FIG. 2B, the empirical recovery rate clearly shows that infant recovery occurred along with the majority of the failures, and was for the failures that lasted less than 12 hours. After the infant recovery, there was a delay of 7.7 hours before aging recovery occurred. Therefore, the threshold was set at $d_0$=12 hours.

Figure 5:
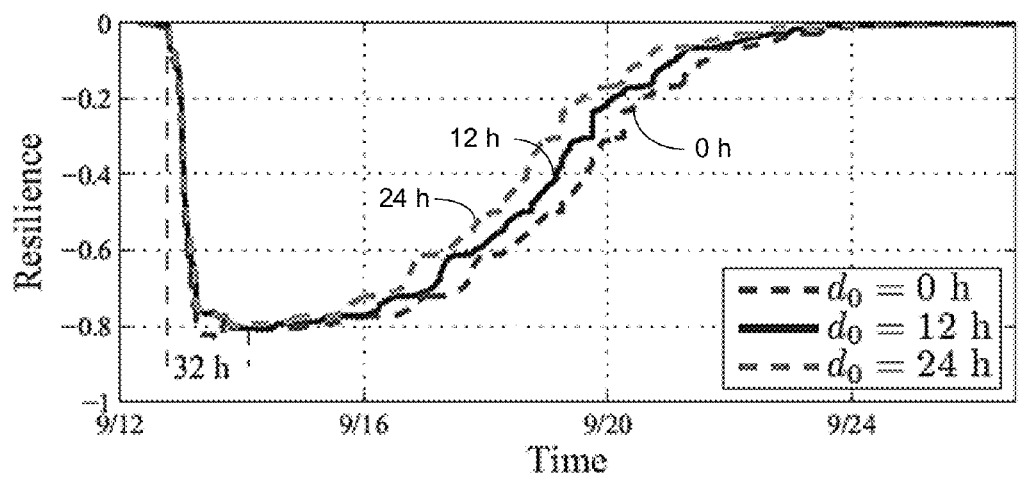
FIG. 5 is a plot illustrating examples of resilience of a power distribution network in accordance with various embodiments of the present disclosure.

The resilience can be calculated using $d_0$=12 in Equation (10). As shown in FIG. 5, the resilience of the entire distribution network decreased from the normal operations along with the failure occurrences, and reached a maximum reduction of 80.7% of total disruptions. The time at the minimum resilience was 32 hours after the initial failure occurrence. This was the most vulnerable time when the infant recovery had already ended and the aging recovery was yet to begin. The minimum resilience indicates that 80.7% of total disruptions needed at least another $d_0$=12 hours to recover. This is consistent with the resilience curve where it took up to 14 days for all disruptions to recover.

What if the threshold $d_0$ was chosen differently? If $d_0=0$ is chosen, the infant recovery would be incorrectly considered as a part of non-resilience. The resulting resilience is thus overly pessimistic with a maximum reduction of 83.7% rather than 80.7% in FIG. 5. On the other hand, if $d_0=24$ is chosen, the threshold falsely excludes parts of aging recovery, resulting in overly optimistic resilience. Hence, identifying an optimal threshold is important.

Figure 6A:
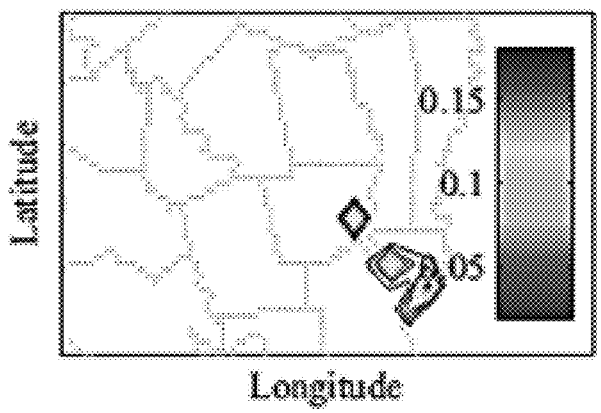
FIGS. 6A through 6F are graphical representations illustrating resilience over a geographical area of the power distribution network in accordance with various embodiments of the present disclosure.
Figure 6C:
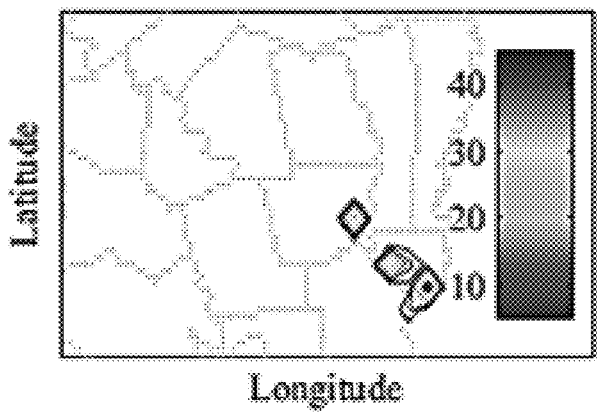
Figure 6E:
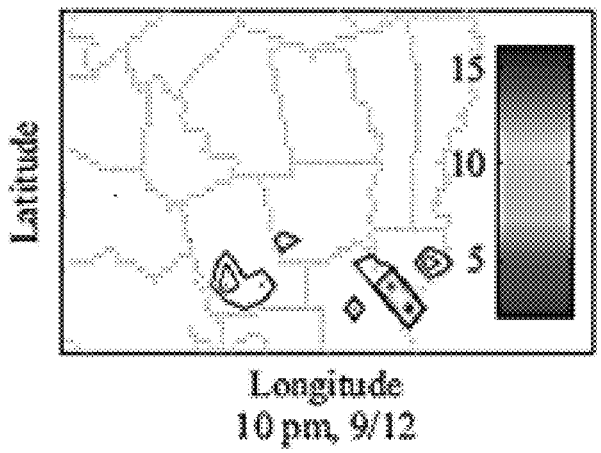
Figure 6B:
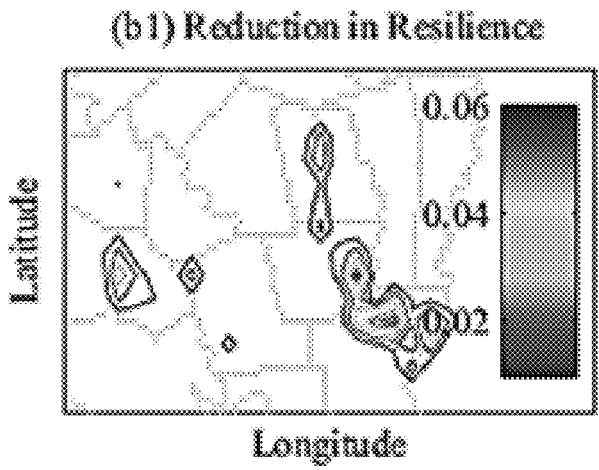
Figure 6D:
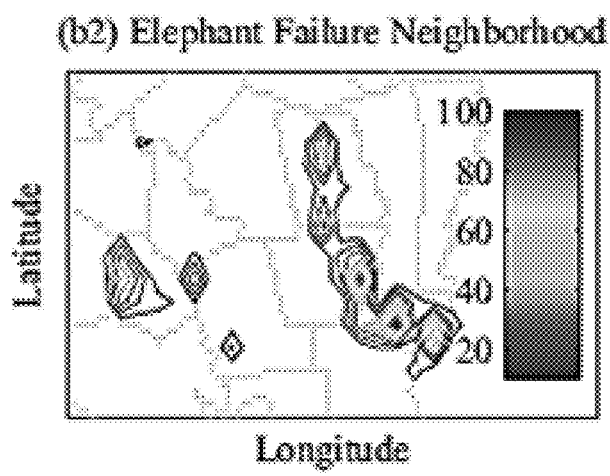
Figure 6F:
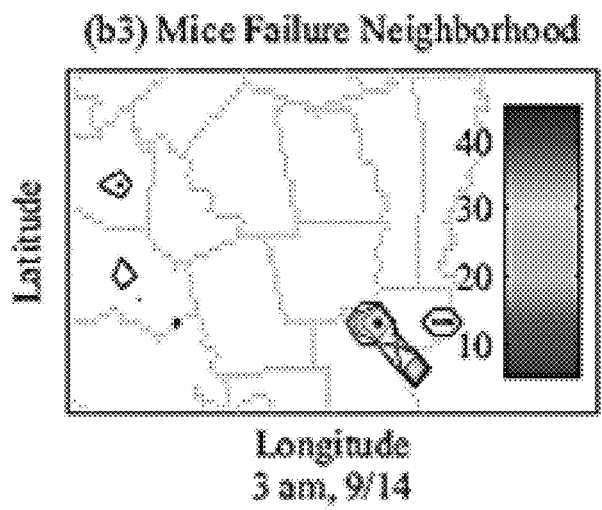

The resilience metric can also be used to identify vulnerable areas in a service region. FIGS. 6A-6F show examples of two snapshots of the resilience over the geographical area of the power distributions. FIGS. 6A and 6B show the percentage reduction (of the total number of disruptions) for the resilience at two time epochs: 4 hours before the landfall and the time of the minimum resilience. The regions with more than 15% and 6% reduction of resilience appear as vulnerable areas for the two time epochs. FIGS. 6C and 6D show the number of elephant failure neighborhoods at the two times respectively. The vulnerable areas coincide with the regions that have a large number of elephant failure neighborhoods. This is consistent with the finding that elephant failure neighborhoods contribute to the majority of the disruptions and thus a significant deduction of the resilience. FIGS. 6E and 6F show the number of mice failure neighborhoods. However, these are not coupled with the vulnerable areas.

Accordingly, resilience of power distribution is pertinent to the energy grid under severe weather. Embodiments of the present disclosure develop an analytical formulation for large-scale failure and recovery of power distribution induced by severe weather. A focus of various embodiments of the present disclosure is on incorporating pertinent characteristics of topological network structures into spatial temporal modeling. Such characteristics include new notations as dynamic failure- and recovery-neighborhoods. The neighborhoods quantify correlated failures and recoveries due to topology and types of components in power distribution. The resulting model is a multi-scale non-stationary spatial temporal random process. Dynamic resilience can then be defined based on the model. Using the model and large-scale real data from Hurricane Ike, unique characteristics were identified. It was found that the failures follow an 80/20 rule, where 74.3% of the total failures result from 20.7% of failure neighborhoods with up to 72 components "failing" together. Thus the hurricane caused a large number of correlated failures. Unlike the failures, the recoveries follow a 60/90 rule, where 59.3% of recoveries resulted from 92.7% of all neighborhoods with either one component alone or two together recovered. Thus about 60% of the recoveries were uncorrelated and needed individual restorations. The failure and recovery processes were further studied through the resilience metric to identify the least resilient regions and time durations.

Part B

Embodiments of the present disclosure contribute a new application in an emerging area of smart energy grid. The application is on learning from failure data how distributed power networks respond to external disturbances such as hurricanes. Learned knowledge provides understanding of how power networks fail and recover in severe weather. Such understanding allows for identification of network vulnerabilities and problem areas, provide indications for network optimization and control, and estimation and planning of network repairs, maintenance and/or improvements.

Power distribution networks lie at the edge of the energy grid, delivering medium and low voltages to residence and organizations. Distribution networks comprise leaf nodes of the energy infrastructure and are thus susceptible to external disturbances. For example, natural disasters cause widespread destructions and service disruptions to distribution networks. There were about 16 major hurricanes and severe storms occurred in north America in the past 5 years, each of which disrupted electricity services from 500,000 to several million customers for days.

Existing approaches rely primarily on empirical approaches for large-scale failures of power distribution. For example, empirical studies have been conducted on assessing damages from large-scale power failures. Monitoring systems have been used in power industry to respond to failures. As hurricanes and severe storms appear to occur frequently and at large-scale, empirical approaches become inadequate for real time failure assessment in a wide geographical area. Furthermore, recovery from large-scale power failures is even less understood. This is evidenced by how difficult it was for utilities to provide accurate recovery time to customers. Overall, quantifiable approaches are lacking and needed for characterizing how power distribution networks respond to external disturbances. This supports discovering and mitigating vulnerabilities for enhancing the power infrastructure.

Unique challenges emerge for quantifying how power distribution networks respond to large-scale external disturbances. The first is randomness. External disturbances such as hurricanes exhibit random behaviors. The resulting power failures occur randomly also. The second is dynamic nature of failures and recoveries due to evolution of external disturbances. For example, a hurricane usually has a landfall with a strong force wind, and then gradually dies down when moving in land. Hence, non-stationarity (randomness and dynamics) is an intrinsic characteristic of large-scale failures.

Non-stationary learning is a natural approach for quantifying non-stationary large-scale failure and recovery of power distribution induced by external disturbances. However, an additional challenge for learning is lack of data. This may appear to be a paradox: A large-scale external disturbance such as a hurricane often results in thousands of power failures, which amounts to a lot of data. However, in the space of external disturbances, a hurricane generates only one sample, i.e., a snap-shot of network failures and recoveries from one external disturbance. Hence, data from an individual disturbance can be valuable and should be used to enable learning. Note that using real data for studying large-scale power failures and recoveries is not yet a common practice for the power infrastructure. Real data on power failures from external disturbance is rare. Recent work shows the strength of combining algorithmic approaches with real data on geographically correlated power failures. The focus there is on power transmission rather than distribution.

Incorporating all challenges, a basic research question includes how to learn non-stationary behaviors of large-scale failure and recovery for distributed power distribution, using real data from one external disturbance. Combining model-based and data-driven methods is a viable approach for limited samples. A model identifies pertinent quantities that determine non-stationary random processes of failure and recovery. Initially, a problem formulation is derived to obtain a model. What remains unknown are the model parameters, which can be learned from the data. Such a combination of model-based and data-driven approaches directs learning to a small number of functions or parameters, and thus makes effective use of data. In addition, a combination of model-based and data driven approaches makes learning explanatory. Learned model parameters bear physical meanings on how distributed power distribution responds to the external disruption.

The current discussion focuses on power failures and recoveries induced by exogenous weather. The time scale of such failures and recoveries can be considered to be a minute to be consistent to that of a hurricane. Power failures can also occur in bursts at small time scales of seconds or less. Such bursty failures are usually due to an internal network structure and not examined in this disclosure. Self-recoveries often occur at the small time scale of subseconds, whereas recovery by field crews usually occurs in minutes or beyond. Hence the model at the time scale of a minute focuses on weather induced failures and recoveries that cannot be repaired through self-healing. Such a model provides understanding about how a distributed power infrastructure responds to external disturbances.

Begin with the spatial scale of network nodes and the temporal scale of a minute. As the data from an external disturbance is insufficient to completely specify a detailed temporal-spatial model, spatial variables can be aggregated into groups. A group can be, e.g., a city that comprises nodes from a small geographical area. The resulting model thus characterizes an entire non-stationary life-cycle of large-scale failure and recovery in time and at geo-locations. Such a spatial-temporal model is multivariate generalization of $GI(t)/G(t)/\infty$ queues to include geo-locations. $GI(t)$'s and $G(t)$'s are arrival (failure) processes and departure (recovery) processes for individual geo-graphical area and "$\infty$" means that it is possible for a recovery to occur immediately after a failure, e.g., less than a minute in this work. Hence, multivariate $GI(t)$'s and $G(t)$'s constitute the model that can completely specify non-stationary behaviors of large-scale failure and recovery at a power distribution network.

Consider one simplified characterization of $GI(t)/G(t)/\infty$ queues to the expected values. What to learn then becomes clear: A small number of pertinent parameters of $GI(t)$ and $G(t)$ at different geo-locations, i.e., failure rates and recovery time distributions. First obtain detailed data on large-scale power failures from a real life example of a natural disaster, Hurricane Ike. Ike caused power failures in the south states of US and affected more than 2 million users in 2008. Learning for two scenarios were devised using the real data. The first learns only temporal processes of non-stationary failure and recovery by aggregating over spatial variables of nodes in the entire network. The second learns geo-location based spatial-temporal processes by aggregating nodes in cities. The modeling facilitates learning where model parameters can be easily estimated using the failure data. The model was then applied to another data set from Hurricane Sandy. Hurricane Sandy caused wide-spread power failures to more than 8 million people in the northeast of US in 2012. The data set comprises aggregated rather than detailed power failures in one of the impacted areas. The approach is shown to be applicable to the aggregated data for estimating failure and recovery rates. The approach also shows what cannot be learned using aggregated data.

In summary, this work presents (a) a novel model based on non-stationary random processes and dynamic queues for weather-induced large-scale failure and recovery of power distribution, (b) simple learning approaches for estimating parameters of the non-stationary model, and (c) applications of the model and non-stationary learning to real data from two hurricanes at different locations.

Figure 7:
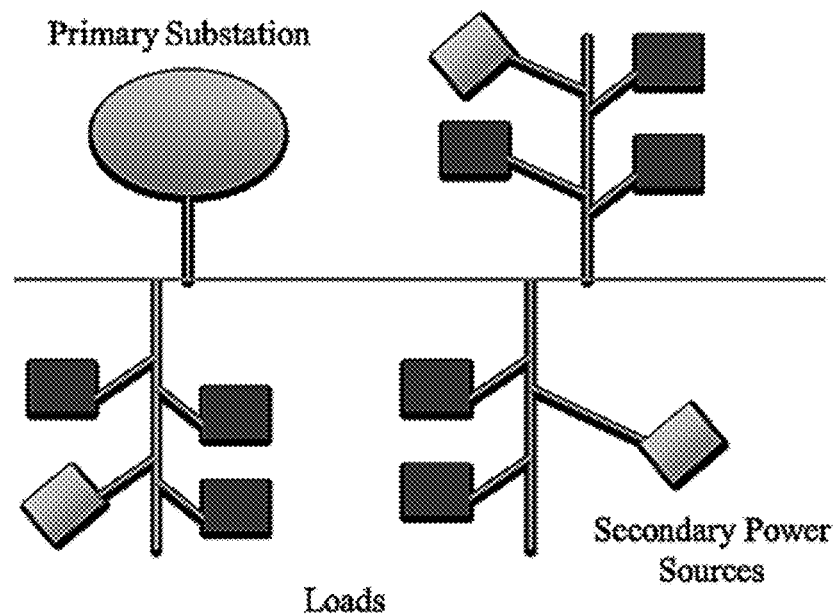
FIG. 7 is schematic diagram illustrating an example of a section of a power distribution network in accordance with various embodiments of the present disclosure.

Examples are provided on the temporal scale, and non-stationarity of failure and recovery. First, the time scale for modeling weather induced failures and recoveries are discussed. A power distribution network comprises components such as substations, feeders, transformers, power circuits, circuit breakers, transmission lines, and meters. An example of a section of a power distribution system is illustrated in FIG. 7, with a commonly used radial topology. Three types of components are shown for illustration: a primary substation, three secondary power sources, and loads. Links correspond to power lines. Assume that either a component or a link can fail during a hurricane. Assume that the substation is used as a primary source during normal operation. The secondary sources, that can be distributed renewable sources, are used for back-up when the primary source fails. Then the following scenarios can occur for failure and recovery:

If all the sources fail due to an external disturbance, there is no electricity supplied to any loads. Hence, the loads experience dependent failures that can occur instantaneously. The scenario of dependent failures also applies to other components upstream in the radial topology that causes loss of electricity at nodes downstream. Dependent failures are often experienced by loads within sub-seconds.

If a link that connects a load to the network fails due to an external disturbance, there is no electricity supplied to the load. Such link failures can occur independently due to fallen trees or power lines. Thus, loads can experience independent loss of electricity. As such independent failures are caused by exogenous weather, they are assumed to occur at a time scale of a minute or beyond. Such a time scale can be estimated through how rapidly a hurricane force wind passes a city. Consider a small city of 1,600 acres as an example. Based on the IEEE standard (IEEE/ASTM SI 10-1997), an approximated "diameter" of the city is about 1.6 miles. Consider the speed of the force wind at 60 miles per hour. It takes about 1.6 minutes for the wind to pass the city. This provides a basis of using a minute as a time scale of weather induced failures.

Recovery depends on the types of failures and recovery schemes. Certain failures can be repaired through self-recovery. For example, if the primary substation fails, the electricity supply to all loads can be recovered when the three secondary sources are in operation. In general, self-recovery and automated reconfiguration built in power distribution usually operate at a time scale of sub-seconds or seconds. However, failures due to external disturbances, e.g., falling trees and power lines, often require manual repair by field crews. Recovery time depends on not only restoration schemes but also environmental constraints, and is thus considered as random in this work. Such manual recovery time is in either minutes or hours or days from failure.

In summary, failures and self-recoveries at a small timescale of seconds or sub-seconds depend on detailed network structure and self-recovery schemes. Failure and recovery at a larger time scale of a minute and beyond are often due to external disturbances that evolve dynamically and randomly.

Figure 8:
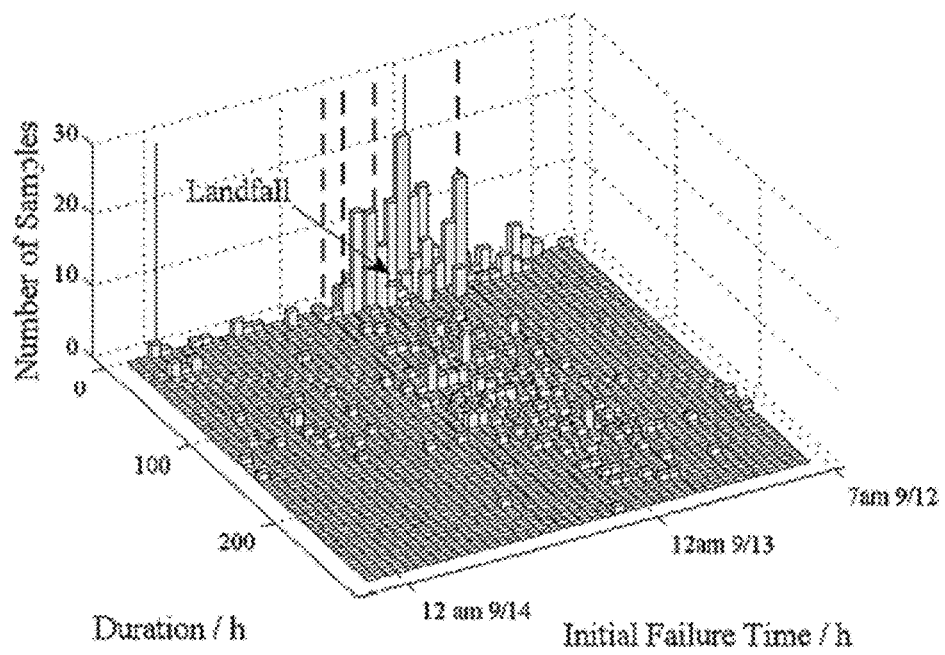
FIG. 8 is an example of a temporal distribution of failure durations in accordance with various embodiments of the present disclosure.
Figure 9:
FIG. 9 is an image illustrating an example of geographical locations of failures during hurricane Ike in accordance with various embodiments of the present disclosure.

To gain intuition on an entire life cycle of failure and recovery of a distribution network, consider a real-life example of large-scale power failures that occurred during Hurricane Ike in 2008. FIG. 8 shows a histogram on failure occurrence time and duration of an operational distribution network before, during and after the hurricane. Each bin has a length (failure occurrence time) of 1 hour and width (duration) of 4 hours. The height of each bin represents the number of failures that occur at time t and last for duration d. FIG. 9 shows geographical distributions of failure occurrences at two different time epochs, where failure occurrence is evidently non-stationary across geographical regions. Cross markers indicate failures that occurred from 7 p.m to 8 p.m. September 12 and circular markers indicate failures that occurred from 5 a.m. to 6 a.m. September 13. Hence,

- Failure occurrence is non-stationary, i.e., random and time-varying;
- Recovery time is non-stationary, i.e., obeys different probability distributions for failures occurred at different time;
- Failure occurrence and recovery time are also non-stationary spatially, i.e., exhibit different distributions for different geo-locations.

Hence, samples on failure occurrence time and duration are not identically distributed but exhibit geo-temporal non-stationarity.

Non-stationary random processes have been studied in the context of drifting concepts. Samples for learning are dynamically drawn from a non-stationary environment. An issue arises on the sample size, i.e., whether data is sufficient for characterizing underlying drifts of distributions.

Learning non-stationary processes exhibits unique challenges in terms of sample size. For simplicity, batch data is assumed to be collected for learning an entire non-stationary life cycle of failure and recovery processes off-line. A challenge here is that there is only one snapshot of a distribution network in space and time from one external disturbance. The number of data sets is often small, e.g., from a few severe storms. Therefore, combining model based and data-driven approaches becomes important, where data can be used to learn a small number of model-parameters from one external disturbance at a time. In addition, combining model-based and data-driven approaches for learning is used for the problem: Learned model parameters exhibit physical meaning for generic network behaviors upon external disturbances.

Large-scale failure and recovery can be formulated based on non-stationary random processes. Begin with the detailed information on nodal statuses in a distribution system. The spatial variables of nodes can be aggregated to obtain temporal evolution of failure and recovery across geographical areas.

A geo-temporal random process provides a theoretical basis for modeling large-scale failures. The temporal variable is time t that is assumed to be continuous at the scale of a minute. The spatial variable can be either geo- or network-location of a node. For simplicity, this work considers geo-location as a spatial variable to focus on location-based failures induced by severe weather. Nodes can be components in a distribution system such as substations, feeders, hubs, transformers, transmission lines, and distributed energy sources. A shorthand notation i is used to specify the index of node i located at $z_i$ with $i \in S=\{1, 2, \ldots, n\}$ for a power distribution network with n nodes. An underlying network topology is assumed to be radial so that cascading failures occurred in mesh networks are not considered.

Let $X_i(z_i,t)$ be the status of the i-th node at time t>0 for $1 \leq i \leq n$. Assume for simplicity that nodes only exhibit two states: $X_i(z_i,t)=1$ if the i-th node is in a failure mode, i.e. without power supply; and $X_i(z_i,t)=0$ if the node is in normal operation. Failures caused by external disturbances exhibit randomness. That is, whether and when a node fails is random and whether and when the failed node recovers is also random. Hence, random processes can be used to characterize failure and recovery for the nodes in the network.

Given time t>0, $P\{X_i(z_i,t+\tau)=1\}$ characterizes the probability that node i is failed in the near future t+τ, where τ>0 is a small time increment. Assume that a node changes state from failure to normal and vice versa. Then for the i-th node, $1 \leq i \leq n$, the probability that node i stays in failure mode in [t,t+τ] can be expressed as:

$$P\{X_i(z_i, t+\tau) = 1\} - P\{X_i(z_i, t) = 1\} = \qquad (11)$$
$$P\{X_i(z_i, t+\tau) = 1, X_i(z_i, t) = 0\} - P\{X_i(z_i, t+\tau) = 0, X_i(z_i, t) = 1\}.$$

Equation (11) assumes Markov temporal dependence, and can be applied to n nodes in a distribution network. The n equations together form a geo-temporal model of a network. Note that statistically dependent failures at the small time scale less than a minute are not considered here, as such failures are often caused by an internal network structure rather than exogenous weather. Spatial dependence is embedded in the model but will be studied explicitly in subsequent work.

When large-scale failures are caused by one external disturbance, information available is from one "snapshot" of temporal spatial network statuses, and thus insufficient for specifying a complete temporal-spatial model at the node level. Hence, nodes can be aggregated over a geographical region (Z), resulting in:

$$\sum_{i:z_i \in \mathbb{Z}} P\{X_i(z_i, t+\tau) = 1\} - \sum_{i:z_i \in \mathbb{Z}} P\{X_i(z_i, t) = 1\} = \qquad (12)$$
$$\sum_{i:z_i \in \mathbb{Z}} P\{X_i(z_i, t+\tau) = 1, X_i(z_i, t) = 0\} -$$
$$\sum_{i:z_i \in \mathbb{Z}} P\{X_i(z_i, t+\tau) = 0, X_i(z_i, t) = 1\}.$$

Here $P\{X_i(z_i,t)=1\}=E\{I[X_i(z_i,t)]\}$, where I(A) is an indicator function with I(A)=1 if the event A occurs, and I(A)=0 otherwise. A geo-temporal process can be defined as follows. $\{N(t,\mathbb{Z}) \in \mathbb{N}, t>0\}$ is a geo-temporal process where the spatial variables (i's) are aggregated for all nodes $z_i$ in a predefined region Z. $N(t,\mathbb{Z})$ is the number of nodes in failure state at time t located in $\mathbb{Z}$ given by:

$$N(t, \mathbb{Z}) = \sum_{i:z_i \in \mathbb{Z}} I[X_i(z_i, t) = 1]. \qquad (13)$$

Combining Equations (12) and (13), gives:

$$E\{\Delta N(t, \mathbb{Z})\} = \sum_{i:z_i \in \mathbb{Z}} P\{X_i(z_i, t+\tau) = 1\} - \sum_{i:z_i \in \mathbb{Z}} P\{X_i(z_i, t) = 1\}, \qquad (14)$$

where $\Delta N(t,\mathbb{Z})=N(t+\tau,\mathbb{Z})-N(t,\mathbb{Z})$ is an increment of the number of failed nodes in a certain region. $\Delta N(t,\mathbb{Z})$ is the result of either newly-failed or newly-recovered nodes. Hence, a failure process and a recovery process can be defined respectively. A failure process $\{N_f(t,\mathbb{Z}) \in \mathbb{N}, t \geq 0\}$ is the number of failures that occurred up to time t. A recovery process $\{N_r(t,\mathbb{Z}) \in \mathbb{N}, t \geq 0\}$ is the number of recoveries that occurred up to time t.

Assuming that $\tau > 0$ is sufficiently small so that failure or recovery occurs at most once to a node during $(t, t+\tau)$, the increments on a failure process and a recovery process satisfy, respectively:

$$E\{\Delta N_f(t, \mathbb{Z})\} = \sum_{i:z_i \in \mathbb{Z}} P\{X_i(z_i, t+\tau) = 1, X_i(z_i, t) = 0\}, \quad (15)$$

$$E\{\Delta N_r(t, \mathbb{Z})\} = \sum_{i:z_i \in \mathbb{Z}} P\{X_i(z_i, t+\tau) = 0, X_i(z_i, t) = 1\},$$

where $\Delta N_f(t,\mathbb{Z}) = N_f(t+\tau,\mathbb{Z}) - N_f(t,\mathbb{Z})$. Similarly, for a sufficiently small $\tau > 0$, it can be assumed that at most one recovery occurs during $(t, t+\tau)$. Hence, Equation (12) can be simplified as:

$$E\{\Delta N(t, \mathbb{Z})\} = E\{\Delta N_f(t,\mathbb{Z})\} - E\{\Delta N_r(t,\mathbb{Z})\}. \quad (16)$$

Furthermore, assuming at time $t_0=0$, $N(t,\mathbb{Z})=0$, $N_f(t,\mathbb{Z})=0$, and $N_r(t,\mathbb{Z})=0$. Aggregating increments in Equation (16) from 0 to t, gives:

$$E\{N(t,\mathbb{Z})\} = E\{N_f(t,\mathbb{Z})\} - E\{N_r(t,\mathbb{Z})\}. \quad (17)$$

Hence, the expected number of nodes in the failure state equals to the difference between the expected failures and the expected recoveries. Group the distribution network of n nodes into m geographical regions $\mathbb{Z}_j$, $1 \leq j \leq m$, based on their geo-locations. A city, e.g., a subdivision, is an example of a geographical region widely-used by utilities. Then the failure-recovery process for the entire distribution network N(t) can be defined as:

$$N(t) = [N(t,\mathbb{Z}_1), N(t,\mathbb{Z}_2), \ldots, N(t,\mathbb{Z}_m)]^T, \quad (18)$$

where $N(t,\mathbb{Z}_j)$ characterizes how local power distribution in region $\mathbb{Z}_j$ responds to an external disturbance.

Non-stationary characteristics on failure and recovery can now be derived. The derivation reveals pertinent quantities that completely model the behaviors of large-scale power failures and recoveries in expected values. This is pertinent to learning a small number of parameters as will be discussed.

A failure process can be characterized to the first moment by failure rate functions. Let $\lambda_f(t) = [\lambda_f(t,\mathbb{Z}_1), \lambda_f(t,\mathbb{Z}_2), \ldots, \lambda_f(t,\mathbb{Z}_m)]^T$ be a vector that comprises the rate function of a failure process, where $\lambda_f(t,\mathbb{Z}_j)$ is the expected number of new failures per unit time at epoch t and region $\mathbb{Z}_j$, for $j=1, 2, \ldots, m$, then:

$$\lambda_f(t, \mathbb{Z}_j) = \lim_{\tau \to 0} \frac{1}{\tau} E\{N_f(t+\tau, \mathbb{Z}_j) - N_f(t, \mathbb{Z}_j)\}. \quad (19)$$

The larger $\lambda_f(t,\mathbb{Z}_j)$ is, the faster failures occur in $\mathbb{Z}_j$ at time t. $\lambda_f(t,\mathbb{Z}_j)$ is referred to as the rate function of the failure process $N_f(t,\mathbb{Z}_j)$. Hence, the failure rate quantifies the intensity of failure occurrence. A non-stationary failure process has a time-varying intensity function $\lambda_f(t,\mathbb{Z}_j)$ across geolocations. Assuming a failure process begins at $t=0$, then $EE\{ \}, \ldots, E\{N_f(t)\} = [E\{N_f(t,\mathbb{Z}_1)\}, \ldots, E\{N_f(t,\mathbb{Z}_m)\}]^T$, where $$E\{N_f(t,\mathbb{Z}_j)\} = \int_0^t \lambda_f(v, \mathbb{Z}_j) dv, \quad (20)$$

for $1 \leq j \leq m$.

A recovery process can be characterized by recovery rate function $\lambda_r(t)$, where $\lambda r(t) = [\lambda_r(t,\mathbb{Z}_1), \lambda_r(t,\mathbb{Z}_2), \ldots, \lambda_r(t,\mathbb{Z}_m)]^T$. $\lambda_r(t,\mathbb{Z}_j)$ is the expected number of new recoveries per unit time at epoch t and region $\mathbb{Z}_j$, with $$\lambda_r(t, \mathbb{Z}_j) = \lim_{\tau \to 0} \frac{1}{\tau} E\{N_r(t+\tau, \mathbb{Z}_j) - N_r(t, \mathbb{Z}_j)\}. \quad (21)$$

A non-stationary recovery process $N_r(t,\mathbb{Z}_j)$ has a time varying rate function. Assuming the temporal failure process begins at $t=0$, then for $1 \leq j \leq m$, $$E\{N_r(t,\mathbb{Z}_j)\} = \int_0^t \lambda_r(v, \mathbb{Z}_j) dv. \quad (22)$$

The recovery rate characterizes how rapidly recovery occurs, which is measured by failure duration D. For a non-stationary recovery process, a failure duration depends on when and where a failure occurs as illustrated in FIG. 8. Such non-stationarity of recovery is characterized by $g(d|t, \mathbb{Z}_j)$ which is a conditional probability density function of failure duration $D=d$ given failure time $T=t$ at region $\mathbb{Z}_j$. For a given threshold $d_0 > 0$, the conditional probability that a duration is bounded by $d_0$ for failures occurred at time t is:

$$P\{D < d_0 | t, \mathbb{Z}_j\} = \int_0^{d_0} g(v|t, \mathbb{Z}_j) dv. \quad (23)$$

When $d_0$ is sufficiently small, this probability characterizes rapid recovery that occurs shortly after failures. For a given $d_0$, the larger $P\{D < d_0 | t, \mathbb{Z}_j\}$ is, the more rapid recovery dominates a recovery process. Given a desired value of probability $P\{D < d_0 | t, \mathbb{Z}_j\}$, the smaller $d_0$ is, the more dominating the rapid recovery is. Rapid recovery is referred to as infant recovery. This terminology is borrowed from infant mortality in survivability analysis. Infant recovery is a desirable characteristic of the smart grid. In contrast, slow recovery is referred to as aging recovery in analogous to aging mortality. Infant and aging recovery can be formally defined as follows. Let $d_0 > 0$ be a threshold value. If a node remains in failure for a duration less than $d_0$; then the recovery is an infant recovery. Otherwise, the recovery is an aging recovery. Infant recovery can be characterized by $P\{D < d_0 | t, \mathbb{Z}_j\}$. Aging recovery is characterized by $P\{D > d_0 | t, \mathbb{Z}_j\}$.

A joint failure-recovery process characterizes an entire life cycle of a failure-recovery process (FRP), and represents the total number of nodes $N(t,\mathbb{Z})$ in failure state at time t and region $\mathbb{Z}$ as shown in Equation (13). The expected number of nodes in failure can be expressed in rate functions, $$E\{N(t, \mathbb{Z}_j)\} = \int_0^t [\lambda_f(v, \mathbb{Z}_j) - \lambda_r(v, \mathbb{Z}_j)] dv. \quad (24)$$

A failure-and-recovery process can be viewed as a birth-death process. However, commonly used birth-death processes have a stationary distribution of failure duration and assume independence between failure occurrence t and failure duration d. Here, these two assumptions do not hold. This implies that failures occurred at different time can last different duration. For example, under strong and sustained hurricane wind, failures that do not happen in day-to-day operation can occur due to falling debris and power lines.

A recovery process can be related to a failure process through a probability density function of failure durations. Theorem: Let $N_f(t,\mathbb{Z}_j)$ be an independent increment (failure) process with a rate function $\lambda_f(t,\mathbb{Z}_j)$, $1 \leq j \leq m$. Let D(t) be the duration of a failure that occurred at time t and in region $\mathbb{Z}_j$. D(t) has a conditional probability density function $g(d|t,\mathbb{Z}_j)$, where $d \geq 0$, $t \geq 0$. Then, the recovery rate $\lambda_r(t,\mathbb{Z}_j)$ satisfies:

$$\lambda_r(t, \mathbb{Z}_j) = \int_0^t g(t-s|s, \mathbb{Z}_j) \lambda_f(s, \mathbb{Z}_j) ds, \quad (25)$$

where $1 \leq j \leq m$, $d = t-s$ with s and t being the failure time and recovery time, respectively.

The foregoing theorem is a corollary of the Transient Little's Theorem. Intuitively, $g(t-s|s,\mathbb{Z}_j)ds$ can be viewed as the probability that a failure occurred at time s and region $\mathbb{Z}_j$, and lasts for a t–s duration. $g(t-s|s,\mathbb{Z}_j)ds\lambda_f(s,\mathbb{Z}_j)$ is the average number of failures per unit time recover after t–s duration, i.e., the recovery rate by definition. Aggregating over all failures occurring prior to time t results in Equation (25).

What to learn now becomes apparent. Failure rate functions and probability density functions of recovery time completely specify our model to the first moment, i.e., $\lambda_f(t,\mathbb{Z}_j)$, for $1 \le j \le m$, and $g(t-s|s,\mathbb{Z}_j)$, for $1 \le j \le m$.

In general, the forms and the parameters of these two functions are unknown, and need to be learned from real data. The learned functions and the parameters can then be used to estimate the empirical processes. The empirical processes are the sample means $\hat{N}(t,\mathbb{Z}_j)$, $\hat{N}_f(t,\mathbb{Z}_j)$, and $\hat{N}_r(t,\mathbb{Z}_j)$ that estimate the true expectations $E\{\hat{N}(t,\mathbb{Z}_j)\}$, $E\{\hat{N}_f(t,\mathbb{Z}_j)\}$, and $E\{\hat{N}_r(t,\mathbb{Z}_j)\}$, respectively.

Next, the foregoing techniques can be applied to a real-life example of large-scale utility-service disruptions caused by a hurricane. Hurricane Ike was one of the strongest hurricanes that occurred in 2008. Ike caused large scale power failures, resulting in more than 2 million customers without electricity, and marked as the second costliest Atlantic hurricane of all time. Reported by National Hurricane Center, the storm started to cause power failures across the onshore areas in Louisiana and Texas on Sep. 12, 2008 prior to the landfall. Ike then made a landfall at Galveston, Tex. on 2:10 a.m. (CDT), Sep. 13, 2008, causing strong winds, flooding, and heavy rains across Texas. The hurricane weakened to a tropical storm at 1:00 p.m. September 13 and passed Texas by 2:00 a.m. September 14.

A major utility provider collected data on power failures from more than ten cities. The failures include failed circuits, fallen poles and power lines, and non-operational substations. The raw data set includes 5152 samples. Each sample comprises the failure occurrence time ($t_i$) and duration ($d_i$) of a component (i) in a distribution network from September 12 through 14, 2008. The accuracy for time t is a minute.

The data set contains bursts of failures that occurred within a minute. As a minute is the smallest time scale for each sample, the bursts are considered as dependent failures. Dependent failures are grouped as one failed entity (i), with a unique failure occurrence time $t_i$ and duration $d_i$. After such preprocessing, the resulting data set had 465 failed entities. Two outliers with negative failure duration were further removed. The remaining 463 failed entities from 7 am September 12 to 4 am September 14 are referred to as nodes. $D=\{t_i,d_i\}_{i=1}^{463}$ is the data set that was used for learning.

Figure 10:
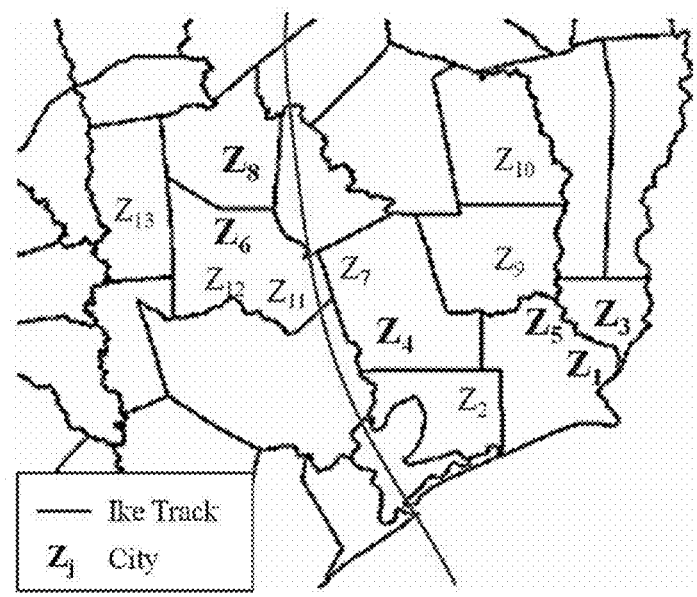
FIG. 10 is a graphical representation illustrating an example of geographical locations of regions associated with the failures of FIG. 9 in accordance with various embodiments of the present disclosure.

Spatial variables $\{\mathbb{Z}_j\}$'s can be either chosen a priori or through learning from data. In this work, $\{\mathbb{Z}_j\}$'s were chosen to be small cities to include a natural living environment of customers. This is widely-used by utility providers. There are 13 cities in the data set, with the geographical locations of the 13 regions illustrated in FIG. 10.

The temporal non-stationarity of the failure-and-recovery process is first examined. Spatial variables can be aggregated across the entire network. This is equivalent to reducing multiple geographical areas to one entire impact-region from the hurricane. Then the geo-temporal failure-recovery process reduces to a temporal process. For notational simplicity, spatial variables are omitted for temporal processes.

Figure 11:
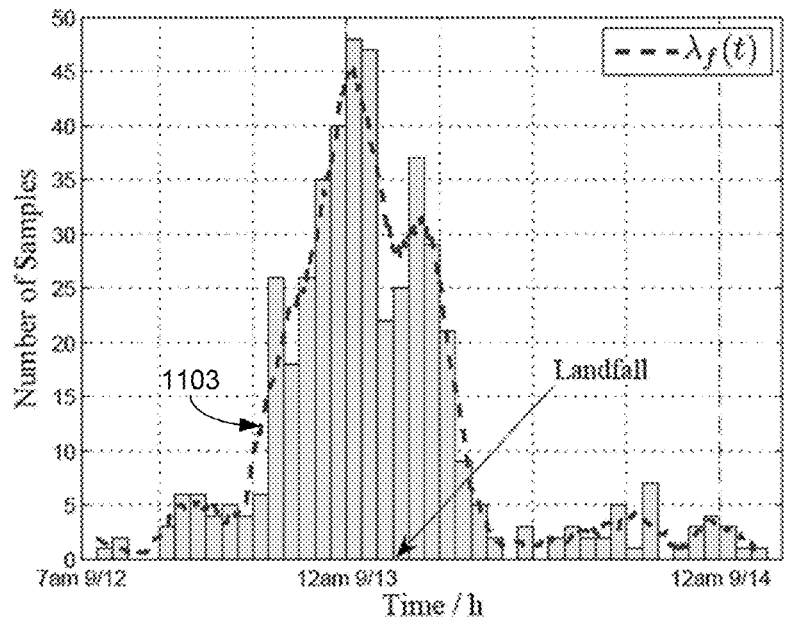
FIG. 11 is a histogram illustrating an example of failure occurrence time and failure rate during hurricane Ike in accordance with various embodiments of the present disclosure.

The empirical rate function can be estimated using a simple algorithm based on moving average: $\lambda_f(t)=[\hat{N}_f(t+\tau)-\hat{N}_f(t-\tau)]/2\tau$, where $\tau$ is chosen to be 5 hours. The two resulting rate function 1103 is overlaid with the samples on the number of failures $\hat{N}_f(t)$ in FIG. 11, where each bin is of duration 1 hour.

The learned failure rate function shows a time-varying rate of new failure occurrence:

Prior to 7 p.m. September 12, the rate was low with fewer than 5 new failures occurring per hour. Hence 5 per hour can be considered the failure rate in day-to-day operation.

At 7 p.m. September 12, the rate initially increased sharply to 25 new failures per hour. In the next 6 hours, the rate reached a peak value of nearly 50 new occurrences per hour. This is consistent to the weather report that a strong wind about 145 mph and flooding impacted the onshore areas prior to the landfall. The time of the peak coincides with the landfall at 2:10 a.m 9/13 CDT.

After staying at the high level for about 12 hours (from 7 p.m. September 12 to 7 a.m. September 13), the rate decreased rapidly back to a low level of less than 5 new failures per hour.

Turning next to the empirical recovery process characterized by g(d|t), the conditional probability density function of failure duration can be learned given failure occurrence time t. As the spatial aggregation removes the geo-location variables, g(d|t) is the conditional probability density function of failure duration of the entire network.

The 463 samples on the failure durations and occurrences are used in the data set. These samples result in a joint empirical distribution $\hat{g}(d|t)$ illustrated in FIG. 8. The height of each bin located at (t,d) represents the number of failures that occur at time t and that last for a duration d. FIG. 8 illustrates the non-stationarity of failure durations. For example, a large number (217) of failures occurred between 7 p.m. September 12 and 8 a.m. September 13, which lasted for more than a day. This indicates that many failures that occurred during the surge of the hurricane were difficult to recover. Hence, a non-stationary distribution for g(d|t) is an appropriate assumption.

Given failure occurrence time t, it can be observed that the distribution of duration is a combination of two components: infant recoveries and aging recoveries. Thus, a mixture model can be selected for the probability density function g(d|t) where d>0, $$g(d|t) = \sum_{j=1}^{l(t)} \rho_j(t) g_j(d|t), \quad (26)$$

where l(t) is the number of mixtures at time t, $\rho_j(t)$ ($1 \le j \le l$) is a weighting factor for the j-th mixture function $g_j(d|t)$, and $\Sigma \rho_j(t)=1$. The weighting factor $\rho_j(t)$ signifies the importance of the j-th component $g_j(d|t)$. For a non-stationary recovery process, these parameters vary with failure time t.

A mixture model is chosen since its parameters exhibit interpretable physical meaning. A parametric family of Weibull mixtures is particularly appealing as the parameters correspond to infant and aging recovery directly. Weibull distributions have been widely used in survival analysis and reliability theory, but not in characterizing recovery from large-scale external disturbances. Specifically, a Weibull distribution is $$w(d \mid t; \gamma(t), k(t)) = \frac{k(t)}{\gamma(t)} \left( \frac{d}{\gamma(t)} \right)^{k(t)-1} e^{-\left(\frac{d}{\gamma(t)}\right)^{k(t)}}, \quad (27)$$

where $d>0$, and $k(t)$ and $\gamma(t)$ are the shape and scale parameters, respectively. Hence, j-th component in Equation (26) is $g_j(d|t)=w(d|t; \gamma_j(t), k_j(t))$. The shape and scale parameters, $k(t)$ and $\gamma(t)$, are pertinent for characterizing the type of recovery. The smaller $k(t)$ and $\gamma(t)$ are, the faster the decay of $g(d|t)$, the shorter the failure duration and thus the faster the recovery. Hence, $k(t)<1$ and moderate $\gamma(t)$ (e.g., $\gamma(t)\sim10$ h or smaller) correspond to infant recovery. $k(t)>1$ and large $\gamma(t)$ (e.g., $\gamma(t)\sim100$ h) correspond to aging recovery.

For simplicity, a piecewise homogeneous function was used to approximate $g(d|t)$. The failure time t can be divided into 5 intervals as illustrated by the dashed lines in FIG. 8. Within interval $\psi_i$ for $1 \le i \le 5$, $g(d|t \in \psi_i) = g_i(d)$ is assumed to be stationary and does not vary with failure time t. For different intervals, $g(d|t \in \psi_i)$'s have different parameters for non-stationarity, $$g(d \mid t \in \psi_i) = \sum_{j=1}^{l_i} \rho_{i,j} g_{i,j}(d; \gamma_{i,j}, k_{i,j}). \quad (28)$$

Figure 12:
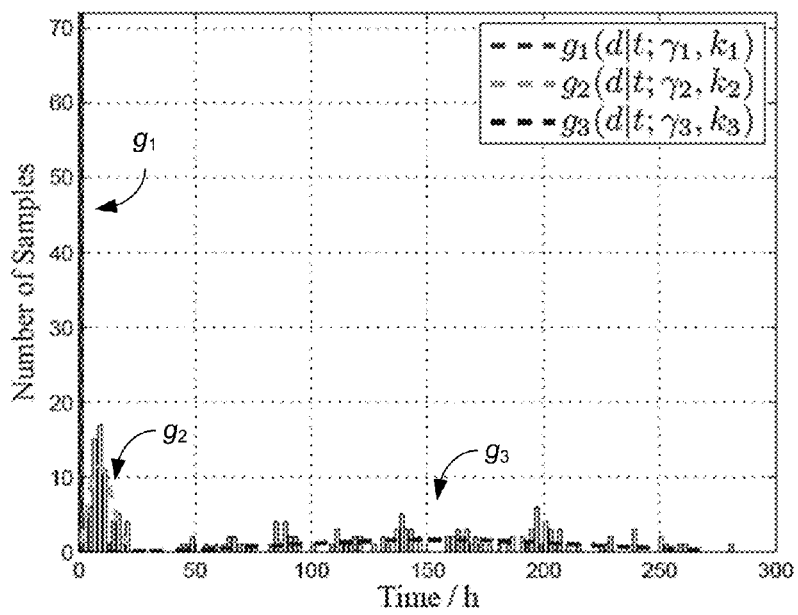
FIG. 12 is a plot illustrating the distribution of failure durations during hurricane Ike in accordance with various embodiments of the present disclosure.

The parameters of the Weibull mixtures within each interval can be learned through maximum likelihood estimation from the data. Failure durations obey different distributions for failures occurring at different intervals, showing the non-stationarity. For example, the first duration $\psi_1$ (7 a.m. September 12 to 7 p.m. September 12) is when the network was not yet impacted widely by Hurricane Ike. Three Weibull mixtures were learned from the data, with the shape, the scale and weighting parameters as (1, 0.71, 0.486), (10.5, 14.4, 0.257) and (10.7, 211.8, 0.257). The first two components result in dominating infant recovery, where 74.3% of failures recovered within a day. In contrast, the third duration $\psi_3$ (3 a.m. September 13 to 3 p.m. September 13) is when the large-scale failures continued to occur after the landfall. Two Weibull mixtures were learned from the data. The shape, the scale and weighting parameters were (5.3, 11.0, 0.323) and (12.4, 112.2, 0.677), showing dominating aging recovery. As the result, only 32.2% of failures recovered within a day. The second duration $\psi_2$ (7 p.m. September 12 and 8 a.m. September 13) is around the hurricane landfall, where about half of the failures that occurred experienced infant recovery within a day (see FIG. 12 for the three Weibull mixtures). For 5 durations overall, the probability of infant recovery within a day changes over time, showing the non-stationary of failure-recovery processes.

Figure 13:
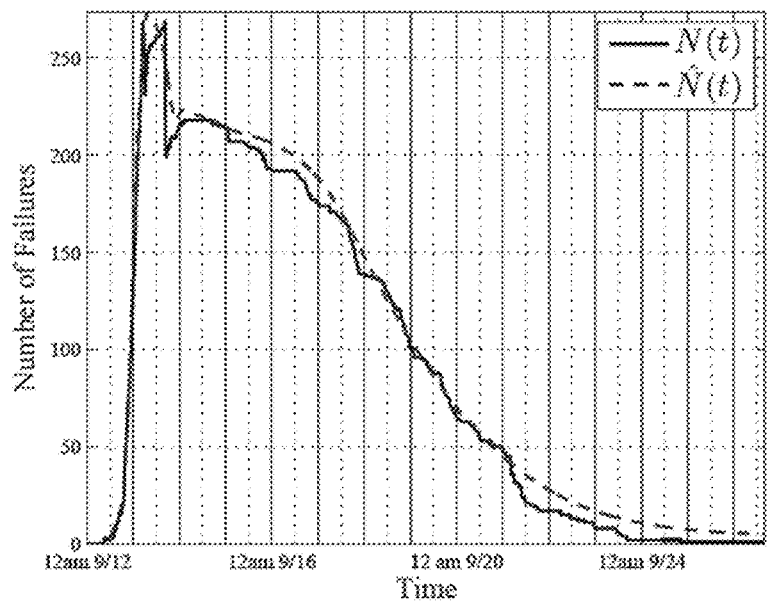
FIG. 13 is a plot comparing an example of a joint failure-recovery process and a reconstructed process in accordance with various embodiments of the present disclosure.

The empirical temporal failure-recovery process $\hat{N}(t)$ can then be reconstructed with learned $\hat{\lambda}_f(t)$ and $\hat{\lambda}_r(t)$ through Equation (24). FIG. 13 shows the comparisons between $\hat{N}(t)$ and $N(t)$, where the reconstructed sample path using learned parameters and the actual sample path from the data set of the failure-recovery process, respectively. The closeness between the two sample paths shows that the piecewise stationary $g(d|t)$ approximates well the actual failure-and-recovery process.

Figure 14:
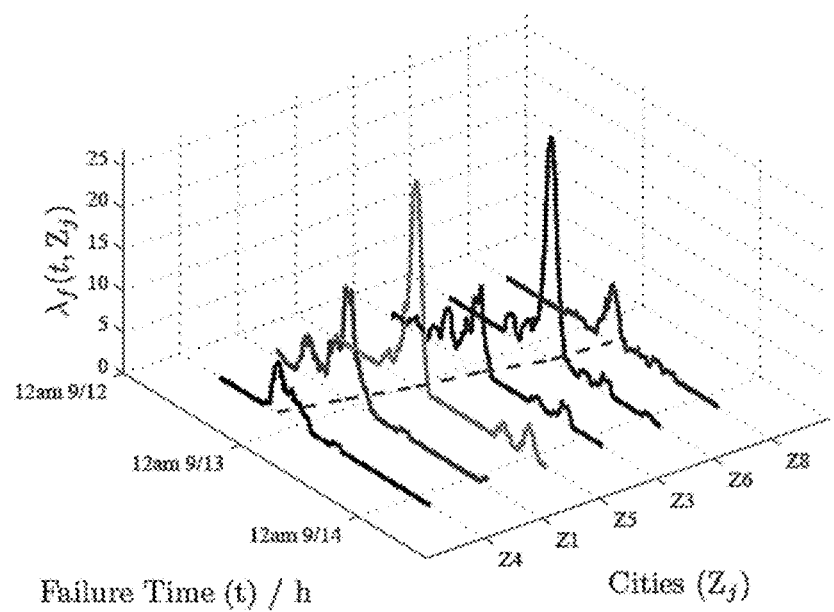
FIG. 14 is a plot illustrating failure rates associated with different regions of FIG. 10 in accordance with various embodiments of the present disclosure.

Geo-location variables can be included to learn the geo-temporal non-stationarity. Failure process $N_f(t)$ is a geo-temporal process with multiple attributes $N_f(t, \mathbb{Z}_j)$ from m geographical regions, $1 \le j \le m$. The empirical failure rate functions $\lambda_f(t, \mathbb{Z}_j)$ for $1 \le j \le m$ are estimated using the same algorithm of moving average. The resulting rate vector $\lambda_f(t)$ is multi-variate, comprising of m time-varying functions. Due to the small sample size, there are 6 out of 13 cities shown in FIG. 10, each of which has sufficient samples ranging from 27 to 101. FIG. 14 shows the empirical geo-temporal failure rates of the 6 cities. The cities are sequenced with respect to the time when the failure rate reached the peak value in each region. The multi-variate failure rates exhibit the following characteristics:

Temporal non-stationarity: At a given geographical region $\mathbb{Z}$, $\lambda_f(t, \mathbb{Z}_j)$ is a time-varying function similar to the bell-shaped curve obtained for the entire network. Consider $\mathbb{Z}_5$ as an example. The failure rate was low (fewer than 5 failures) prior to 7 p.m. September 12. Then, the rate increased sharply and reached the maximum value of 25 new failures per hour, at about 1 a.m. September 13. After that, the rate decreased rapidly to fewer than 5 failures.

Spatial non-stationarity: At a given time t, $\lambda_f(t, \mathbb{Z}_j)$ is a spatially-varying function. The peak values of failure rates vary from 1.5 to 27 per hour across the 9 cities. The time when the rate reached the peak value varies between 8 p.m. September 12 to 7 a.m. September 13, and is depicted as a dashed line at the bottom in FIG. 14.

Spatial temporal non-stationarity: The regions are then labeled with respect to the order of failure rates that reached the maximum value in FIG. 14. For example, the failure rate at City $\mathbb{Z}_4$ reached the peak value first, followed by the failure rates at City $\mathbb{Z}_1$ through City $\mathbb{Z}_8$. FIG. 14 shows the geo-temporal characteristic that failure rates at different city reached their peak values approximately from the coast to inland. This appears to be consistent to the movement of the hurricane track indicated in FIG. 10.

To learn the geo-temporal non-stationary recovery, the mixture model of Equation (26) can be extended to a geo-temporal bivariate mixture, where for $1 \le j \le m$, $$g(d \mid t, \mathbb{Z}_j) = \sum_{i=1}^{l(t, \mathbb{Z}_j)} \rho_i(t, \mathbb{Z}_j) g_i(d \mid t, \mathbb{Z}_j). \quad (29)$$

Again the learning focuses on the 6 cities with sufficient samples. Dependencies of failure durations among the cities were not examined because of the small sample size. Applying the piecewise homogeneous distribution function in Equation (28) to each region $\mathbb{Z}_j$, gives:

$$g(d \mid t \in \psi_i, z \in \mathbb{Z}_j) = \sum_{\zeta=1}^{l_{i,j}} \rho_{\zeta,i,j} g_{\zeta,i,j}(d). \quad (30)$$

Here, each component $g_{\zeta,i,j}(d)$ is a Weibull distribution $w(d; \gamma_{\zeta,i,j}, k_{\zeta,i,j})$. Mixture $g(d|t \in \psi_i, z \in \mathbb{Z}_j)$'s and their coefficients vary with respect to not only failure occurrence time $\psi_i$ (temporal non-stationarity), but also geo-locations $\mathbb{Z}_j$'s (spatial non-stationarity).

Figure 15:
FIG. 15 is an image illustrating an example of geographical locations of infant and aging recoveries from the failures of FIG. 9 in accordance with various embodiments of the present disclosure.

Applying the maximum likelihood estimation, the estimated parameters of Weibull distributions in the 6 cities can be obtained. Note that due to the small sample size in some of the regions, the parameters of distributions of failure duration have to be assumed, in the implementation, not varying with a failure occurrence time within a region. The probability of infant recoveries is also computed accordingly. Three cities (1, 4, and 6) show a similar percentage of infant recovery from 66% to 68% whereas the remaining cities (3, 5, and 8) have infant recovery from 40% to 45%. TABLE 1 shows the learned model parameters for two example cities. FIG. 15 shows the geographical distribution of infant recoveries (lighter crosses) and aging recoveries (darker crosses) for the 6 cities ($d_0$=24 hours).

TABLE 1

|  | 1 | 2 | 3 | P{d < 24} |
|---|---|---|---|---|
| $g(d|z \in \mathbb{Z}_1)$ |  |  |  |  |
| $\rho_{1,\zeta}$ | 0.3478 | 0.3188 | 0.3333 | 66.63% |
| $\gamma_{1,\zeta}$ | 0.0045 | 12.1893 | 197.0316 |  |
| $k_{1,\zeta}$ | 0.2490 | 2.7891 | 3.7629 |  |
| $g(d|z \in \mathbb{Z}_3)$ |  |  |  |  |
| $\rho_{3,\zeta}$ | 0.3000 | 0.1500 | 0.5500 | 45.37% |
| $\gamma_{3,\zeta}$ | 0.0650 | 12.2138 | 129.7408 |  |
| $k_{3,\zeta}$ | 0.2897 | 3.9992 | 2.8037 |  |

The probability of infant recovery as well as model parameters vary across different geographical regions, showing the spatial non-stationarity of the recovery process. Examining more details, adjacent cities (e.g., 1 and 3) that are close to the coast can exhibit different percentages of infant recovery. Faraway cities (e.g., city 8 which is far in land and city 5 which is close to the coast) can also exhibit a similar percentage of infant recovery.

Learning using real data from another real-life example of large-scale disruptions caused by Hurricane Sandy is now examined. This provides an understanding how the model and learning approach can be generalized to other hurricanes. Hurricane Sandy had a landfall at Northeastern United States on Oct. 28, 2012. Hurricane Sandy resulted in more than 6 million customers without electricity for days. The state with the most customers without power was New Jersey, where about 1.98 million customers lost power supplies.

A utility company reported the number of failures (outages) in more than 10 counties in New Jersey from Oct. 28, 2012 to Nov. 22, 2012. The aggregated number of reported outages is a sample in our data set. Each sample comprises a given geo-location and time t at the scale of 15 minutes (the reporting interval). The geo-location variable $\mathbb{Z}_j$ corresponds to a county in New Jersey for $1 \leq j \leq 14$. The data set comprises 2275 such samples, i.e., $\{N(t,Z_j)\}_{j=1}^{14}$ for time t from October 28 to Nov. 22, 2012. FIG. 17A plots an example of the data. Note that such aggregated data does not provide accurate occurrence time or duration of each power failure.

Learning begins with the aggregated number of failures $N(t,Z_j)$ for $1 \leq j \leq 14$, from which failure- and recovery-rates can be estimated accordingly. This is a reverse process to learning from the detailed failure data in Hurricane Ike.

To learn the failure rate, recall that $$\lambda_f(t) = \frac{d}{dt} E[N_f(t)]$$

from Equation (20), and $$\lambda_f(t) - \lambda_r(t) = \frac{d}{dt} E[N(t)]$$

from Equation (24). This suggests that a lower bound $\hat{\Delta}_{fl}(t)$ on the failure rate can be estimated from the aggregate number of failures at time t as:

$$\hat{\lambda}_{fl}(t, \mathbb{Z}_j) = \frac{d}{dt} N(t, \mathbb{Z}_j), \quad (31)$$
$$\text{if } t = t^*,$$

where $t^*$ is a time epoch when $N(t^*, Z_j)$ increases.

Figure 16:
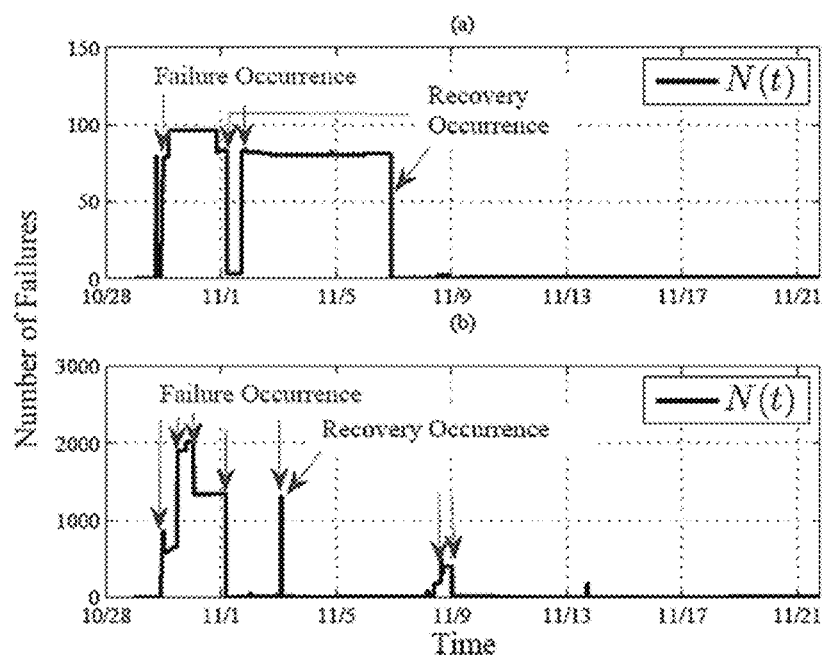
FIG. 16 includes plots illustrating examples of the number of failures during hurricane Sandy in accordance with various embodiments of the present disclosure.

To determine how to obtain such an estimate, characteristics of raw (time series) data $N(t, Z_j)$ are examined at the county level. FIG. 16 shows two examples of the number of aggregated failures $N(t, \mathbb{Z}_j)$ at two different counties in New Jersey. $N(t, \mathbb{Z}_j)$ shows sharp increases and sharp decreases. A sharp increase occurs when the failure rate exceeds the recovery rate whereas a sharp decrease happens when recovery rate exceeds the failure rate. Hence, a change point in $N(t, \mathbb{Z}_j)$ can be used to identify a lower bound for either a failure rate or a recovery rate. In addition, a sharp increase/decrease indicates a salient rather than noisy change point, where a lower bound can be obtained accurately.

First obtain the positive increments from $N(t, Z_j)$ for each region $Z_j$ using Equation (31). Then aggregate the increments over the 14 regions to obtain a lower bound $\hat{\lambda}_{fl}(t)$ for the failure rate of the utility network. $\hat{N}_f(t)$, the estimated lower bound on the number of failures up to time t, can then be obtained by integrating $\hat{\lambda}_{fl}(t)$, which is shown in FIG. 17B.

To learn the empirical recovery rate, Equation (31) can be applied except that $t^*$ corresponds to the time epoch of a decrease in the number of failures. FIG. 17C shows an estimated lower bound $\hat{\Delta}_{rl}(t)$ for the recovery rate and the cumulative number of recoveries $N_r(t)$, respectively.

Since the aggregated data from Hurricane Sandy does not contain detailed recovery time for each failure, it is impossible to learn the time-varying distribution of failure duration g(d|t). Nevertheless, the aggregated data can be used to estimate a stationary distribution of recovery time, i.e., g(d). As the detailed information on failure duration is not available from the data, we consider a simple distribution with one Weibull mixture $g(d; \gamma, k)$. Applying discrete samples to the Theorem, the reconstructed recovery rate $\hat{\Delta}_{rl}(t)$ can be related with $g(d; \gamma, k)$ and $\hat{\Delta}_{fl}(t)$ as $$\tilde{\lambda}_{rl}(i \cdot \delta) \approx \sum_{j=0}^{i} g(i \cdot \delta - j \cdot \delta) \tilde{\lambda}_{fl}(j \cdot \delta) \delta, \quad (32)$$

where $\delta$=15 minutes is the step size, and $i\delta$ is the discrete time. Weibull parameters $\gamma$ and k can then be estimated to minimize the estimation error $\|\tilde{\lambda}_{rl}(t) - \hat{\Delta}_{rl}(t)\|^2$. FIG. 18 shows the estimated Weibull distribution, where the shape parameter $\widehat{k}$=1.3094 and the scale parameter $\hat{\gamma}$=54.1684. The resulting stationary distribution of failure durations is then used to reconstruct a lower bound for the recovery rate. FIG. 18 shows the estimated $\hat{\Delta}_{rl}(t)$ from the data set and the reconstructed $\tilde{\Delta}_{rl}(t)$. Reconstructed $\tilde{\Delta} \tilde{N}_{rl}(t)$ thus provides a profile on how the recovery varies with time.

Learning from Hurricane Ike and Hurricane Sandy results in the following findings:
  Failure process: Failure rates were time-varying for both Hurricane Ike and Hurricane Sandy. The corresponding failure processes were non-stationary in time and geographical regions. However, the failure rates exhibit different characteristics at the county level for Hurricane Ike and Hurricane Sandy: The failure rates for Hurricane Ike appear to vary gradually. However, the failure rates for Hurricane Sandy exhibit sharp changes, showing that failures occurred in groups. When aggregated over geographical regions, failure rates for both hurricanes exhibit similar characteristics, i.e., first rapidly increasing and then decreasing.

Recovery process: Learned recovery rates from Hurricane Ike and Hurricane Sandy were both time-varying. For Hurricane Ike, the learned probability distributions of failure durations exhibit non-stationarity in time and geo-locations, and depend on when failures occur. Such distributions constitute both infant and aging recovery, as shown in TABLE 1 and FIG. 15. The degree of infant recovery, however, is different at different cities. Three out of the six chosen cities recovered more rapidly then the rest. Failures with infant and aging recoveries are also inter-leaving in geo-locations.

The recovery for the provider network from Hurricane Sandy shows a nearly steady rate of 7000 recoveries per hour. In addition, the estimated Weibull distribution of the failure duration exhibits stronger aging recovery than infant recovery. A lack of infant recovery for this utility provider may indicate that power distribution networks suffered virulent disruptions during Hurricane Sandy. The recovery can thus be difficult.

Note that failures and recoveries can occur simultaneously within a 15 minute interval. That is why the amount of increase in $N(t,Z_j)$ is a lower bound of the actual failure rate $\lambda_f(t,Z_j)$. When the number of failures increased rapidly, e.g., from October 28 to October 31, recovery appeared to be minor. When the hurricane passed the area after October 31, recovery dominated. This is shown by the lower bounds of the failure- and the recovery-rate in FIGS. 17A-17C and 18.

The type of available data can be important for learning non-stationary behaviors of power distribution in response to external disruptions. The accurate failure data from Hurricane Ike characterizes an entire life cycle of failure and recovery processes. Data from Hurricane Sandy is aggregated and thus lack of exact information on individual failure occurrence and duration. Hence, learning is to infer failure- and recovery processes, which is a reverse process to that used for Hurricane Ike. The 15-minute sampling interval seems to be sufficient for estimating the lower bounds of failure- and recovery-rates from Hurricane Sandy. The aggregated data was insufficient for characterizing a non-stationary distribution of failure duration but could be used to learn a stationary distribution as an approximation.

To deal with the small sample size, a rule of thumb was used where training samples should be several times more than parameters. For Hurricane Ike, 20 or more samples seemed to be sufficient for estimating temporal characteristics of failure- and recovery-rates but insufficient when the spatial non-stationarity was studied. This suggests that the algorithm need to be enhanced, e.g., to identify spatial scales appropriate for aggregation.

The model assumes an underlying radial topology, where failures can be considered as independent increments at large temporal spatial scales (minutes, cities). Detailed network configuration may be included in the model. For example, topology and power flows are two possible characteristics that can be included for failures and recoveries. Failure- and recovery-process at a small time scale of subseconds then need to be considered accordingly.

Non-stationary geo-temporal random processes can be used to model large-scale failure and recovery of power distribution induced by hurricanes. In particular, multivariate geo-location based $GI(t)/G(t)/\infty$ queues provide such non-stationary failure- and recovery processes. The non-stationary failure and recovery can be completely characterized to the expected values by time-varying failure rate and probability distribution of recovery time across geographical regions.

Real data from two hurricanes was used to learn failure and recovery processes. Learning detailed failure data from Hurricane Ike revealed that the failure process across different geographical regions follows a similar trend to that of the hurricane. However, the failure- and recovery-processes exhibit different infant and aging recovery across geographical regions. Learning aggregated data from an impact area by Hurricane Sandy shows that our model can infer failure- and recovery rates using aggregated data. The failure rates have more significant discrete components for Hurricane Sandy than for Hurricane Ike at geographical regions. The recovery process is dominated by aging recovery for one utility network from Hurricane Sandy but comprises a significant component of infant recovery for another utility from Hurricane Ike. This shows that $GI(t)/G(t)/\infty$ model can be used for general failure- and recovery-processes in dynamic queues. Note that these findings are for power distribution through open rather than underground networks.

Supporting Information

Modeling: Joint disruption, recovery, cost processes, and resilience studies utilize analytical modeling of failure and recovery as well as impacts to customers. Large-scale failure and recovery induced by severe weather exhibit tremendous randomness and dynamics that result from evolving weather conditions. The randomness and the dynamics are also reflected by how providers (DSOs) and customers are impacted. Hence, failure, recovery and the impact form processes are dependent on time, geo- and system-locations. Therefore, resilience is a network problem from the physical infrastructure to services to customers. The role of modeling is to relate individual failures and recoveries as well as impacts to customers at a large scale. Pertinent and simple quantities are then derived to characterize the processes (materials and methods), including disruption rates, time-varying probabilities of failures and recoveries, and expected costs to customers. These quantities serve as guidance for identifying vulnerability (non-resilience) using large-scale real data.

Details on modeling are now presented. Modeling starts from a basic level of a node that is either a power or protective device. A node failure corresponds to either a damaged power component or an activated protective device. The occurrence of failure i can be represented by an indicator function, $I[F_i^{(f)}(t)]$, where $F_i^{(f)}(t)$ is an event that node i fails in time duration $(t-\Delta t, t]$ for sufficiently small $t>0$. $I[A]=1$ if event A occurs; and $I[A]=0$, otherwise. For power distribution with a radial topology, a failure occurs locally without cascading. However, a failure can cause so-called outages where a component loses power without being damaged. For example, a failure at the upstream of a radial topology can cause outages at components downstream. The occurrence of an outage (j) can be represented by an indicator function, $I[F_i^{(o)}(t)]$. Define $N_i(t)$ as the neighborhood of failure i, where $N_i(t)$ comprises the induced outages. Then $j \in N_i(t)$. The outages and the failure are assumed to occur at the same time, i.e., $I[F_j^{(o)}(t)|F_i^{(f)}(t)]=1$; if $j \in N_i(t)$. A system-disruption $F_i^{(d)}(t)$ is either a failure (d=f) or an outage (d=o). A node loses power upon a disruption, thus a disruption is already assumed to be detected. This enables real data collected from power distribution to be used.

Recovery occurs when failures are repaired. The speed of recovery can be characterized by how long a disruption lasts. Let $D_k(v)$ be the duration of a disruption that occurs at time v. Indicator function $I[D_k(v) > t-v]$ represents a recovery event, where a system disruption occurs at v and is yet to recover at t, $0 < v < t$.

Failures occur randomly in time and locations. For example, given a severe weather event such as Hurricane Sandy, fallen debris can randomly cause failures, e.g., bring down wires and result in nonfunctional substations. Likewise, recoveries involve randomness such as terrain conditions in the aftermath of a severe weather event. Spatial temporal random processes can thus be used to model failures and recoveries:

Disruption process: $\{I[F_i^{(d)}(v)], i \in S(v), v > 0\}$,
Recovery process: $\{I[D_k(v) > t-v], k \in \overline{S}(t), 0 < v < t\}$,
Joint disruption-recovery process: $\{I[F_i^{(d)}(v)], I[D_k(v) > t-v], i \in S(v), k \in \overline{S}(t), 0 < v < t\}$, where $S(v)$ and $\overline{S}(t)$ comprise nodes at time v in normal operation and at time t in disruption, respectively. As disruptions are random and varying with time, so are $S(v)$ and $\overline{S}(t)$. A joint process results from the fact that recoveries and disruptions can occur concurrently in an area.

A system disruption at power distribution directly interrupts electricity services to customers, and thus induces cost $C_i^{(d)}(t)$. Disruption rate $\lambda_i^{(d)}(t)$ is the first moment, a simplest quantity that characterizes both the system disruption process and its cost. In particular, $\lambda_i^{(d)}(t)$ is the average increment of the cost $\Delta C_i^{(d)}(t)$ on newly affected customers caused by system-disruption i in $(t-\Delta t, t]$. Such a disruption rate can be obtained from the stochastic equation. Given $S(t)$, a set of nodes in normal operation at $t-\Delta t$, $$\lambda_i^{(d)}(t) = \lim_{\Delta t \to 0} \frac{E[\Delta C_i^{(d)}(t) | S(t)]}{\Delta t} \tag{33}$$

where d=f (failure) or d=o (outage). $E[\cdot]$ is the conditional expectation over randomly occurring disruptions given state $S(t)$. For $\Delta t > 0$ to be sufficiently small, at most one disruption occurs in $(t-\Delta t, t]$.

As an example, assume the occurrence of disruption i incurs cost $c_i$ to the affected customers (e.g., $c_i$ can represent the number of customers affected). The cost to customers at time t from the failure and the outages are respectively, $$C_i^{(f)}(t) = c_i I[F_i^{(f)}(t)],$$

$$C_i^{(o)}(t) = \sum_{j \in N_i(t)} c_j I[F_j^{(f)}(t) | F_i^{(f)}(t)] I[F_i^{(f)}(t)]. \tag{34}$$

Furthermore, when each disruption incurs unit cost $c_i = 1$, the customer disruption rate reduces to the system-disruption rate, which is the average number of new failures and outages occurred per unit time. Hence disruption rate $\lambda_i^{(d)}(t)$ relates failures with impacts to customers.

Prolonged service interruptions affect customers significantly. Thus, the cost needs to include disruption durations. Consider again disruption i that occurs in $(v-\Delta v, v]$. Let $h_i(v,t) = \min\{I[D_k(v) > t-v], I[D_k(v) < t-v]\}$ for $0 < v < t$. $h_i(v,t)$ represents whether or not the disruption is restored by time t. Let $h_i(C_i(v), D(v))$ be a function of disruption duration $D_i(v)$ and the cost of the occurrence $C_i(v)$. Let $G_i(v,t)$ be the combined cost to customers at time t, where $$G_i(v,t) = f_i(D_i(v), C_i(v)) h_i(t,v). \tag{35}$$

When impacts to customers also involve randomness, the cost forms one other spatial temporal point process connecting system disruptions, recoveries and impacts to customers:

$$\{G_i(v,t), i \in S(v), 0 < v < t\}, \tag{36}$$

where t is the time for the cost to be assessed and v is when disruption i occurs. Assuming that, given the occurrence time, a disruption and its recovery are conditionally independent. The conditional expectation of the cost given $i \in S(v)$ can be characterized by the system disruption rate and the cost, $$E\{I[F_i^{(d)}(v)] G_i(v,t) | i \in S(v)\} = \lambda_i^{(d)}(v) \Delta v E[G_i(v,t) | i \in S(v)], \tag{37}$$

The total cost can then be obtained for all disruptions in an area that occur up to time t, $$E[C(t)] = \int_0^t E_{S(v)}\{\lambda_i^{(d)}(v) E[G_i(v,t) | i \in S(v)]\} dv, \tag{38}$$

where $E[\cdot | i \in S(v)]$ is the conditional expectation over randomly occurring disruptions in time and locations. Intuitively, $\lambda_i^{(d)}(v) dv$ is the average number of newly-occurred disruptions in $(v-dv, v]$. $\lambda_i^{(d)}(v) G_i(v,t) dv$ is the resulting total cost to the interrupted customers at time t, $0 < v < t$. The integration adds up all disruptions and thus all costs occurred in $[0,t]$.

The above expression extends the derivations for non-stationary queuing network to each disruption at a fine scale, not only temporal but also spatial. Here the system disruption rate and the cost both vary spatially and temporally. Thus the disruption, recovery and cost processes are non-stationary. $\lambda_i^{(d)}(v)$ and $E[G_i(v,t) | i \in S(v)]$ are also coupled with state $S(v)$, resulting in non-linear relationships in general.

Example: While the cost $G_i(v,t)$ can take a general form, a special case is given by $$G_i(v,t) = c_i \min\{D_i(v), t-v\}, \tag{39}$$

where $c_i$ is the number of interrupted customers by disruption i. When $D_i(v) < t-v$, $G_i(v,t) = c_i D_i(v)$. Such cost is the aggregated customer minutes of interruption (CMI), a commonly used performance metric by Distribution System Operators (DSOs).

Generalized Scaling-Law of Disrupted Customers Empirical Scaling-Law:

To characterize the extent of affected customers by a local disruption, define a generalized scaling law as a mapping between the two quantities: $W(x):P(x)$. $W(x)$ is the conditional probability for a customer to be interrupted given that a system-disruption affects more than x customers. $P(x)$ is the probability for a disruption to interrupt more than x customers (or the probability that a system disruption interrupts more than x customers). Such a generalized scaling law extends the 80-20 rule where $W(x) \sim 0.8$ and $P(x) \sim 0.2$ to other values, i.e., $0 \le W(x), P(x) \le 1$ for a range of x. Define empirical complementary cumulative distribution functions (CCDF) $\tilde{P}(x)$ and $\tilde{W}(x)$ as follows, where x is the number of customers affected by one disruption.

Given the data set $\{x_1, x_2, \ldots, x_n\}$, where $x_i$ is the number of customers disrupted by the i-th disruption. For $x > 0$, $$\tilde{P}(x) = \frac{\sum_i I[x_i > x]}{n}, \quad (40)$$

$$\tilde{W}(x) = \frac{\sum_i x_i I[x_i > x]}{\sum_i x_i}.$$

$\tilde{P}(x)$ and $\tilde{W}(x)$ can be estimated using bootstrapping methods, with a procedure given below. Algorithm 1—estimating $\tilde{P}(x)$ and $\tilde{W}(x)$:

1. Construct an empirical probability distribution for boostrap from the data set $\{x_1, x_2, \ldots, x_n\}$, where $x_i$ is the number of customers affected by the i-th system disruption. For simplicity choose a uniform distribution, where each sample is randomly drawn with probability $1/n$.
2. At each iteration k, draw a set of random samples of size n (or smaller) with replacement. Compute $\tilde{P}_k(x)$ and $\tilde{W}_k(x)$ for a given x through Equation (40).
3. Repeat Step 2 K times to obtain a set of estimators $\{\tilde{P}_1(x), \ldots, \tilde{P}_K(x)\}$. $\tilde{P}(x)$ is the sample mean of $\{\tilde{P}_k(x), k=1, \ldots, K\}$, and the estimation error $\in(\tilde{P}(x))$ is the sample variance. Obtain a confidence interval $\delta(\tilde{P}(x)) = \Phi_\alpha \sqrt{\in(\tilde{P}(x))}$ at level $(1-\alpha)$, where $\Phi_\alpha$ refers to the standard normal distribution.
4. Obtain $\tilde{W}(x)$ and the error bound $\delta(\tilde{W}(x))$ similarly to Step 3.

Recovery and Cost:

Delays in Recovery. For simplicity, the number of pending repairs can be used to characterize delays in recovery. Specifically, the delay of a disruption can be counted as the number of others that occur after but recover before its own restoration. Such delay reflects a centralized view of a DSO, although local repairs can occur simultaneously at multiple areas of a service territory. Delays characterized in this way consider a service region as a centralized queue. Occurrences of system-disruptions are analogous to arrivals at the queue. Recoveries are departures from the queue. A procedure is provided below on finding the delays. Algorithm 2—finding delays given data set $\{(v_i, t_i); 1 \le i \le n\}$, where $v_i$ and $t_i$ are respectively the occurrence and recovery-time of disruption i:

1. Find the sequence of disruption occurrences: Sort the occurrences $v_i$'s from minimum to maximum.
2. Find the sequence of recoveries: Sort the recovery time $t_i$'s from minimum to maximum.
3. Find delay: Consider disruption j which occurs after but recovers before disruption i, i.e., $v_i < v_j$ and $t_j < t_i$ for $j \ne i$. The delay of recovery for disruption i counts the number of such disruptions, $$\delta_i = \sum_{j \ne i} I[v_i \le v_j, t_j < t_i]. \quad (41)$$

Here $\delta_i = 0$ indicates that the disruption i is recovered either immediately without delay or with priority (i.e., restored prior to the disruptions occurred earlier). A positive $\delta_i$ indicates delay.

Scaling Law of Recovery. A scaling law of recovery can be derived to quantify the difference in restoration between the hurricane period and daily operations. Let $W_r(\delta)$ be the conditional probability of interrupted customers given that system disruptions are not yet restored at delay $\delta$. Let $\tilde{P}_r(\delta)$ be the probability of disruptions that are restored within $\delta$. The mapping from $P(\delta)$ to $W(\delta)$ forms a scaling-law for customers to recover. Such a scaling-law shows how the generalized scaling-law of disrupted customers is reduced provided the delay of recoveries. The longer the delay (time), the more service should be restored, and thus the more disrupted-customers are reduced. The corresponding empirical probabilities are $$\tilde{W}_r(\delta) = \frac{\sum_i x_i I[\delta_i \ge \delta]}{\sum_i x_i}, \quad (42)$$

$$\tilde{P}_r(\delta) = \frac{\sum_i I[\delta_i < \delta]}{n},$$

where $x_i$ is the number of customers affected by disruption i and n is the total number of disruptions. The mapping for recovery is in fact similar to that for disruptions except that delay is now a variable. Hence the empirical scaling-law $\tilde{W}_r(\delta)$: $\tilde{P}_r(\delta)$ can be learned from data following similar steps to those in Algorithm 1. Parameters used are the same as those in estimating the generalized scaling-law.

Figure 19:
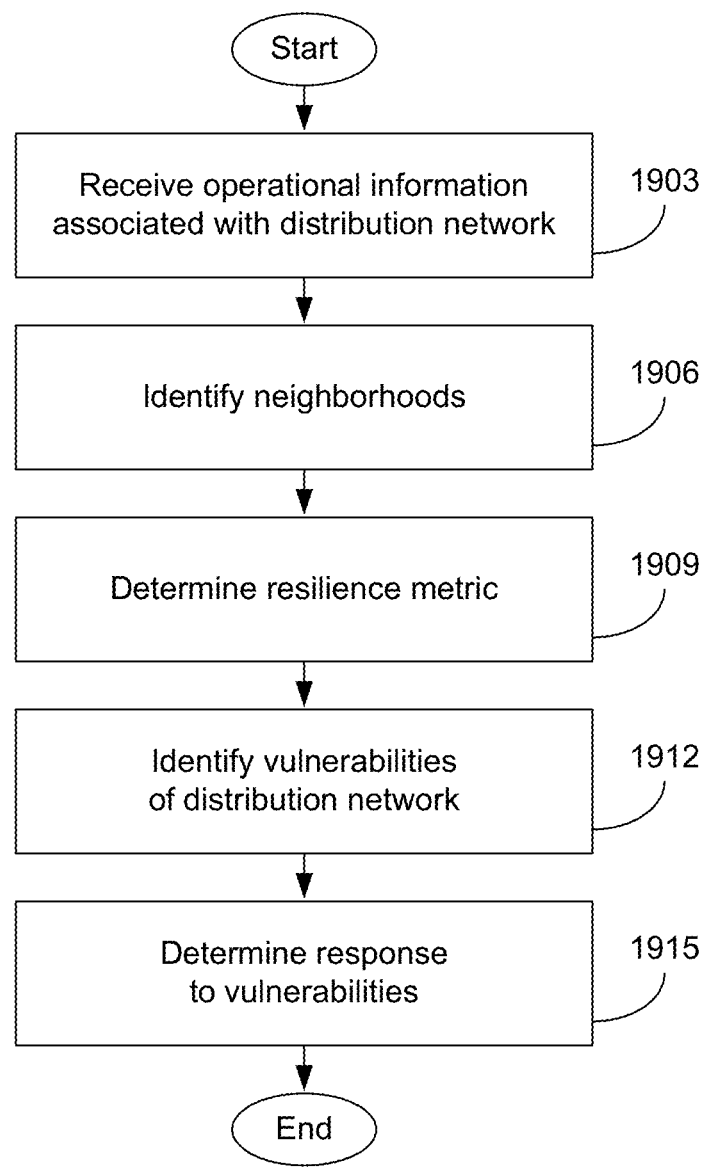
FIG. 19 is a flow chart illustrating an example of distribution modeling and/or evaluation of a power distribution network in accordance with various embodiments of the present disclosure.

Referring next to FIG. 19, shown is a flow chart illustrating an example of distribution modeling and/or evaluation of a power distribution network. Beginning at 1903, operational information associated with the distribution network is received. The operational information can include historical information related to previous operation of the distribution network and stored in a data store that can be locally and/or remotely located. The operational information can also include real time information that is received from one or more distribution monitoring devices located in the distribution network. The information can include operational information of network components such as, but not limited to, transmission lines, switch gear, generators, etc.

At 1906, failure and recovery neighborhoods are identified. The neighborhoods can be determined based at least in part upon the topology of the power distribution network and/or the operational information associated with the distribution network. A resilience metric associated with at least a portion of the distribution network is determined at 1909. The resilience metric can be associated with a geographical region of the power distribution network. At 1912, one or more vulnerability of the power distribution network can then be identified based at least in part upon the resilience metric and a response can be determined at 1915. For example, a region may be identified as being highly vulnerable to failure because of transmission line or switch gear conditions. A response team can then be dispatched to address the situation or planning for repairs and/or maintenance can be adjusted based upon the identified vulnerabilities.

Figure 20:
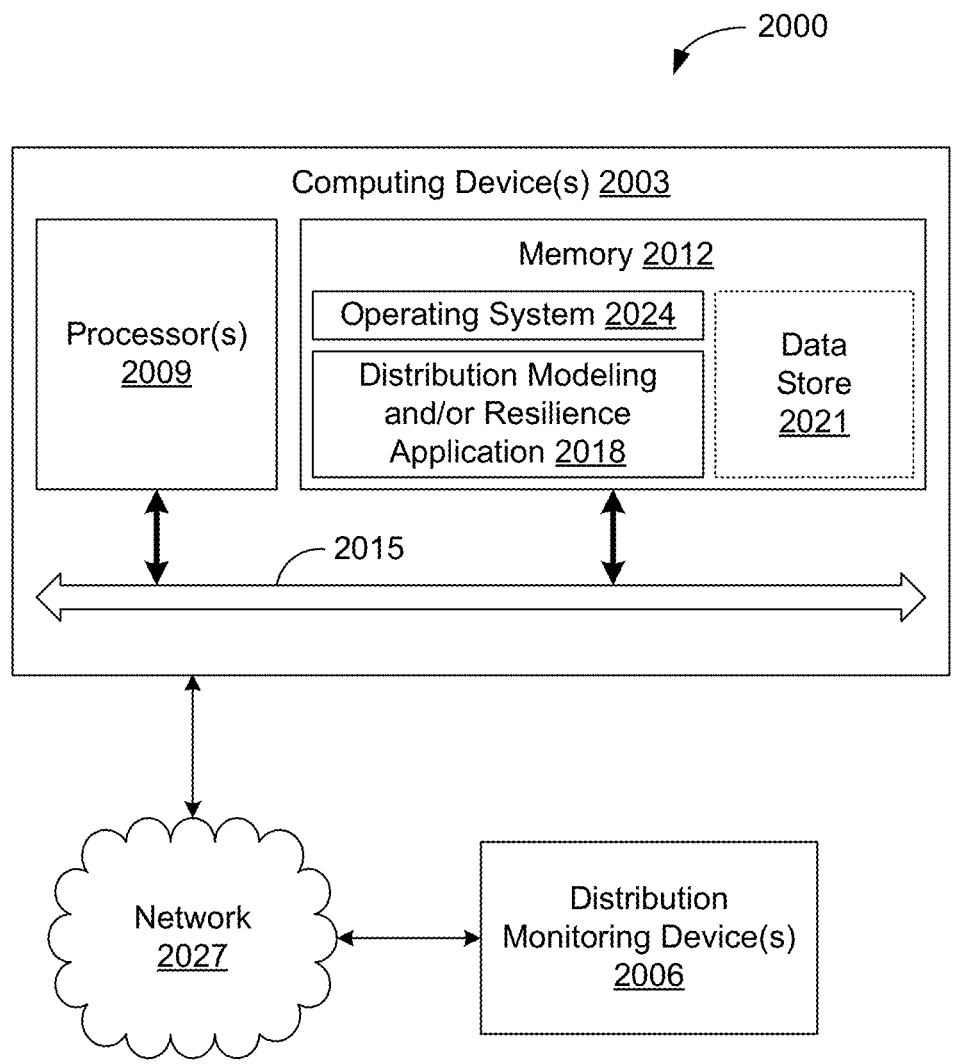
FIG. 20 is an example of a system that may be utilized in power distribution analysis and control according to various embodiments of the present disclosure.

Referring now to FIG. 20, shown is an example of a system 2000 that may be utilized in the monitoring and control of soil conditions. The system 2000 includes one or more computing device(s) 2003 and one or more distribution monitoring device(s) 2006 that can be distributed about a power distribution network to provide indications of failures and/or recoveries in the power distribution network. For example, the distribution monitoring device(s) 2006 can monitor availability of electrical power by monitoring conditions of components of the distribution network. The computing device 2003 includes at least one processor circuit, for example, having a processor 2009 and a memory 2012, both of which are coupled to a local interface 2015. To this end, the computing device(s) 2003 may comprise, for example, a server computer or any other system providing computing capability. The computing device(s) 2003 may include, for example, one or more display devices such as cathode ray tubes (CRTs), liquid crystal display (LCD) screens, gas plasma-based flat panel displays, LCD projectors, or other types of display devices, etc. The computing device(s) 2003 may also include, for example various peripheral devices. In particular, the peripheral devices may include input devices such as, for example, a keyboard, keypad, touch pad, touch screen, microphone, scanner, mouse, joystick, or one or more push buttons, etc. Even though the computing device 2003 is referred to in the singular, it is understood that a plurality of computing devices 2003 may be employed in the various arrangements as described above. The local interface 2015 may comprise, for example, a data bus with an accompanying address/control bus or other bus structure as can be appreciated.

Stored in the memory 2012 are both data and several components that are executable by the processor 2009. In particular, stored in the memory 2012 and executable by the processor 2009 include a distribution modeling and/or resilience application 2018 and potentially other applications. Also stored in the memory 2012 may be a data store 2021 and other data. The data stored in the data store 2021, for example, is associated with the operation of the various applications and/or functional entities described below. For example, the data store may include sample analysis results, corrective measures, and other data or information as can be understood. In addition, an operating system 2024 may be stored in the memory 2012 and executable by the processor 2009. The data store 2021 may be may be located in a single computing device or may be dispersed among many different devices.

The distribution monitoring device 2006 is representative of a plurality of devices that may be communicatively coupled to the computing device 2003 through a network 2027 such as, e.g., the Internet, intranets, extranets, wide area networks (WANs), local area networks (LANs), wired networks, wireless networks, networks configured for communication over a power grid, or other suitable networks, etc., or any combination of two or more such networks. The distribution monitoring device 2006 may comprise, for example, a processor-based system such as a computer system or other application specific monitoring system with communication capabilities. In some embodiments, a distribution monitoring device 2006 may be directly connected to the computing device 2003.

The components executed on the computing device 2003 include, for example, a distribution modeling and/or resilience application 2018 and other systems, applications, services, processes, engines, or functionality not discussed in detail herein. The distribution modeling and/or resilience application 2018 can receive information regarding the monitored distribution network that is provided to a distribution monitoring device 2006. The computing device 2003 may also receive stored information regarding a power distribution network for modeling and evaluation of the network.

It is understood that there may be other applications that are stored in the memory 2012 and are executable by the processor 2009 as can be appreciated. Where any component discussed herein is implemented in the form of software, any one of a number of programming languages may be employed such as, for example, C, C++, C#, Objective C, Java, Java Script, Perl, PHP, Visual Basic, Python, Ruby, Delphi, Flash, or other programming languages.

A number of software components are stored in the memory 2012 and are executable by the processor 2009. In this respect, the term "executable" means a program file that is in a form that can ultimately be run by the processor 2009. Examples of executable programs may be, for example, a compiled program that can be translated into machine code in a format that can be loaded into a random access portion of the memory 2012 and run by the processor 2009, source code that may be expressed in proper format such as object code that is capable of being loaded into a random access portion of the memory 2012 and executed by the processor 2009, or source code that may be interpreted by another executable program to generate instructions in a random access portion of the memory 2012 to be executed by the processor 2009, etc. An executable program may be stored in any portion or component of the memory 2012 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

Also, the processor 2009 may represent multiple processors 2009 and the memory 2012 may represent multiple memories 2012 that operate in parallel processing circuits, respectively. In such a case, the local interface 2015 may be an appropriate network that facilitates communication between any two of the multiple processors 2009, between any processor 2009 and any of the memories 2012, or between any two of the memories 2012, etc. The local interface 2015 may comprise additional systems designed to coordinate this communication, including, for example, performing load balancing. The processor 2009 may be of electrical or of some other available construction.

Although the distribution modeling and/or resilience application 2018, and other various systems described herein, may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those skilled in the art and, consequently, are not described in detail herein.

The flowchart of FIG. 19 shows functionality and operation of an implementation of portions of a distribution modeling and/or resilience application 2018. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor 2009 in a computer system or other system. The machine code may be converted from the source code, etc. If embodied in hardware, each block may represent a circuit or a number of interconnected circuits to implement the specified logical function(s).

Although the flowchart of FIG. 19 shows a specific order of execution, it is understood that the order of execution may differ from that which is depicted. For example, the order of execution of two or more blocks may be scrambled relative to the order shown. Also, two or more blocks shown in succession in FIG. 19 may be executed concurrently or with partial concurrence. Further, in some embodiments, one or more of the blocks shown in FIG. 19 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein, including the distribution modeling and/or resilience application 2018, that comprises software or code can be embodied in any non-transitory computer-readable medium for use by or in connection with an instruction execution system such as, for example, a processor 2009 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as, for example, electronic, magnetic, optical, electromagnetic, infrared, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A method for identifying vulnerabilities in power distribution networks through node resilience of the power distribution network, comprising:
    defining, in a data store of a computing device, a topology of a power distribution network, the power distribution network comprising a plurality of nodes that each represent a component in the power distribution network, and the topology comprising a hierarchy of a plurality of levels, each of the plurality of levels comprising at least one node of the plurality of nodes, the topology comprising indications of dynamic failure and recovery neighborhoods in the power distribution network;
    monitoring, by the computing device, operational information of the plurality of nodes to detect at least one disrupted node in the power distribution network and at least one disruption time associated with the at least one disrupted node;
    in response to detecting the at least one disrupted node, determining, for each of the at least one disrupted node, by the computing device, a plurality of nodes that comprise a failure neighborhood of that respective disrupted node, based at least in part upon the topology of the power distribution network and operational information associated with a subset of the plurality of nodes of the power distribution network at a time after the at least one disruption time of that respective disrupted node;
    detecting, by the computing device, that at least one of the plurality of nodes that comprise the failure neighborhood has recovered from a disruption condition;
    in response to detecting that at least one of the plurality of nodes has recovered, identifying, by the computing device, a recovery neighborhood of the at least one of the plurality of nodes that has recovered;
    determining, by the computing device, a change in a resilience metric, over a period of time, based at least in part upon one or more changes in the operational information, over the period of time, of each node in the failure neighborhood of the at least one disrupted node and the recovery neighborhood of the at least one of the plurality of nodes that has recovered; and
    identifying, by the computing device, a vulnerability of the power distribution network based at least in part upon the change in the resilience metric over the period of time, generating an indication of the vulnerability within the power distribution network, and determining a response to the vulnerability which includes at least one of: adjusting a configuration of the power distribution network or modifying operation of the power distribution network.

2. The method of claim 1, wherein the operational information is received from a plurality of distribution monitoring devices associated with the power distribution network.

3. The method of claim 1, wherein the operational information is supplemented with historical information associated with the plurality of nodes of the power distribution network.

4. The method of claim 1, wherein the resilience metric is based at least in part upon recovery rates associated with a geographic region of the power distribution network.

5. The method of claim 1, wherein the vulnerability is associated with a geographic location contained within the power distribution network.

6. The method of claim 5, wherein the vulnerability is associated with a group of nodes located in the geographic location and a network location.

7. The method of claim 1, wherein each node in the plurality of nodes is related to another node in the plurality of nodes by a geographic relationship.

8. The method of claim 1, wherein the one or more changes in the operational information of the each node in the plurality of nodes is based at least in part on one or more changes in the operational information of a node at a level different than a level of the each node.

9. The method of claim 1, wherein the topology of the power distribution network defined in the data store includes a geolocation of each of the plurality of nodes and identifying the vulnerability of the power distribution network includes identifying a geolocation of the vulnerability.

10. The method of claim 1, wherein determining the response is based at least in part upon the operational information of the plurality of nodes of the power distribution network.

11. A system for identifying vulnerabilities within power distribution networks through node resilience of the power distribution network, comprising:
at least one processor;
a data store;
a memory device storing instructions, which when executed by the at least one processor, cause the at least one processor to, at least:
define, in the data store, a topology of a power distribution network, the power distribution network comprising a plurality of nodes that each represent a component in the power distribution network, and the topology comprising a hierarchy of a plurality of levels, each of the plurality of levels comprising at least one node of the plurality of nodes, the topology comprising indications of dynamic failure and recovery neighborhoods in the power distribution network;
monitor operational information of the plurality of nodes to detect at least one disrupted node in the power distribution network and at least one disruption time associated with the at least one disrupted node;
in response to detecting the at least one disrupted node, determine for each of the at least one disrupted node, a plurality of nodes that comprise a failure neighborhood of that respective disrupted node, based at least in part upon the topology of the power distribution network and operational information associated with a subset of the plurality of nodes of the power distribution network at a time after the at least one disruption time of that respective disrupted node;
detect that at least one of the plurality of nodes that comprise the failure neighborhood has recovered from a disruption condition;
in response to detecting that at least one of the plurality of nodes has recovered, identify a recovery neighborhood of the at least one of the plurality of nodes that has recovered;
determine a change in a resilience metric, over a period of time, based at least in part upon one or more changes in the operational information, over the period of time, of each node in the failure neighborhood of the at least one disrupted node and the recovery neighborhood of the at least one of the plurality of nodes that has recovered; and
identify a vulnerability of the power distribution network based at least in part upon the change in the resilience metric over the period of time, generate an indication of the vulnerability within the power distribution network, and determine a response to the vulnerability which includes at least one of: adjusting a configuration of the power distribution network or modifying operation of the power distribution network.

12. The system of claim 11, wherein the operational information is received from a plurality of distribution monitoring devices associated with the power distribution network.

13. The system of claim 11, wherein the operational information is supplemented with historical information associated with the plurality of nodes of the power distribution network.

14. The system of claim 11, wherein the resilience metric is based at least in part upon recovery rates associated with a geographic region of the power distribution network.

15. The system of claim 11, wherein the vulnerability is associated with a geographic location contained within the power distribution network.

16. The system of claim 15, wherein the vulnerability is associated with a group of nodes located in the geographic location and a network location.

17. The system of claim 11, wherein each node in the plurality of nodes is related to another node in the plurality of nodes by a geographic relationship.

18. The system of claim 11, wherein the one or more changes in the operational information of the each node in the plurality of nodes is based at least in part on one or more changes in the operational information of a node at a level different than a level of the each node.

19. The system of claim 11, wherein the topology of the power distribution network defined in the data store includes a geolocation of each of the plurality of nodes and identifying the vulnerability of the power distribution network includes identifying a geolocation of the vulnerability.

20. The system of claim 11, wherein the response is determined based at least in part upon the operational information of the plurality of nodes of the power distribution network.

* * * * *